(12) United States Patent
Elmegreen et al.

(10) Patent No.: US 8,405,279 B2
(45) Date of Patent: Mar. 26, 2013

(54) COUPLING PIEZOELECTRIC MATERIAL GENERATED STRESSES TO DEVICES FORMED IN INTEGRATED CIRCUITS

(75) Inventors: Bruce G. Elmegreen, Yorktown Heights, NY (US); Lia Krusin-Elbaum, Yorktown Heights, NY (US); Glenn J. Martyna, Yorktown Heights, NY (US); Xiao Hu Liu, Yorktown Heights, NY (US); Dennis M. Newns, Yorktown Heights, NY (US); Kuan-Neng Chen, Hsinchu (TW)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/532,991

(22) Filed: Jun. 26, 2012

(65) Prior Publication Data
US 2012/0270353 A1 Oct. 25, 2012

Related U.S. Application Data

(62) Division of application No. 12/632,154, filed on Dec. 7, 2009, now Pat. No. 8,247,947.

(51) Int. Cl.
*H01L 21/02* (2006.01)
(52) U.S. Cl. ........ 310/328; 310/318; 310/339; 310/340; 427/100
(58) Field of Classification Search .................. 310/318, 310/328, 339, 340; 427/100
See application file for complete search history.

(56) References Cited

U.S. PATENT DOCUMENTS

| | | | |
|---|---|---|---|
| 3,138,726 A | 6/1964 | Samuelson | |
| 4,419,598 A | 12/1983 | Spitz et al. | |
| 5,231,326 A | 7/1993 | Echols | |
| 5,760,675 A | 6/1998 | Lee et al. | |
| 5,872,372 A | 2/1999 | Lee et al. | |
| 5,883,419 A * | 3/1999 | Lee et al. | 257/417 |
| 6,083,762 A * | 7/2000 | Papen et al. | 436/180 |
| 6,392,934 B1 | 5/2002 | Saluel et al. | |
| 6,548,942 B1 * | 4/2003 | Panasik | 310/364 |
| 7,221,579 B2 | 5/2007 | Krusin-Elbaum et al. | |
| 7,253,488 B2 | 8/2007 | Zhan et al. | |
| 7,394,089 B2 | 7/2008 | Doyle et al. | |
| 7,411,818 B1 | 8/2008 | Elmegreen et al. | |
| 2006/0054926 A1 | 3/2006 | Lahreche | |

(Continued)

OTHER PUBLICATIONS

B.S. Kang et al.; "Pressure-induced changes in the conductivity of AlGaN/GaN high-electron mobility-transistor membranes;" Applied Physics Letters, vol. 85, No. 14, Oct. 4, 2004; pp. 2962-2964.

(Continued)

*Primary Examiner* — Walter Benson
*Assistant Examiner* — Bryan Gordon
(74) *Attorney, Agent, or Firm* — Cantor Colburn LLP; Louis Percello

(57) ABSTRACT

A coupling structure for coupling piezoelectric material generated stresses to an actuated device of an integrated circuit includes a rigid stiffener structure formed around a piezoelectric (PE) material and the actuated device, the actuated device comprising a piezoresistive (PR) material that has an electrical resistance dependent upon an applied pressure thereto; and a soft buffer structure formed around the PE material and PR material, the buffer structure disposed between the PE and PR materials and the stiffener structure, wherein the stiffener structure clamps both the PE and PR materials to a substrate over which the PE and PR materials are formed, and wherein the soft buffer structure permits the PE material freedom to move relative to the PR material, thereby coupling stress generated by an applied voltage to the PE material to the PR material so as change the electrical resistance of the PR material.

27 Claims, 22 Drawing Sheets

U.S. PATENT DOCUMENTS

| | | | |
|---|---|---|---|
| 2007/0235784 | A1 | 10/2007 | Krusin-Elbaum et al. |
| 2008/0289417 | A1* | 11/2008 | Okada .................. 73/504.03 |
| 2009/0026890 | A1 | 1/2009 | Goat et al. |
| 2010/0328984 | A1* | 12/2010 | Elmegreen et al. ........... 365/72 |
| 2011/0133603 | A1 | 6/2011 | Elmegreen et al. |

OTHER PUBLICATIONS

F.F.C. Duval et al.; "High Frequency PZT Composite Thick Film Resonators;" Integrated Ferroelectrics, 63, 2004; pp. 27-33.

C.J. Glassbrenner et al.; "Thermal Conductivity of Silicon and Germanium from 3K to the Melting Point*;" Physical Review, vol. 134, No. 4A, May 18, 1964, pp. A1058-A1069.

A. Husmann et al.; "Dynamical Signature of the Mott-Hubbard Transition in Ni(S,Se)2," Science, vol. 274; Dec. 13, 1996; pp. 1874-1876.

A. Jayaraman et al.; "Continuous and Discontinuous Semiconductor-Metal Transition in Samarium Monochalcogenides Under Pressure;" Physical Review Letters, vol. 25, No. 20; Nov. 16, 1970; pp. 1430-1433.

Jon Maimon et al.; "Chalcogenide-Based Non-Volatile Memory Technology;" IEEE Aerospace Conf. Proceedings, 2001, pp. 2289-2294.

G. Krill et al.; "Physical Properties of Compounds NiS2-xSex with Pyrite Structure: Metal-Non Metal Transition, Evidence of the Existence of an Antiferromaagnetic Metallic Phase;" Journal de Physique, vol. 10, No. 37; Oct. 1976; pp. C4-23-C427.

R. Lengsdorf et al.; "The observation of the insulator-metal transition in EuNio3 under high pressure;" Journal of Physics: Condensed Matter, 16; 2004; pp. 3355-3360.

C. Liu et al.; "Pressure-induced insulator-conductor transition in a photoconducting organic liquid-crystal film;" Letter to Nature, vol. 418; Jul. 11, 2002; pp. 162-164.

Maxim Lebedev et al.; "Effect of Thickness on the Piezoelectric Properties of Lead Zirconate Titanate Films Fabricated by Aerosol Deposition Method;" Jpn. J. Appl. Phys. vol. 41, 2002, pp. 6669-6673.

Stefan Lai et al.; "OUM—A 180 nm Nonvolatile Memory Cell Element Technology for Stand Alone and Embedded Applications;" IEEE, IEDM Tech Digest, 2001, pp. 803-806.

Ju. H. Krieger, "Acousto-Ferroelectric RAM-New Type of Nonvolatile Memory Device," IEEE, pp. 53-55, 2007.

Hidekuni Takao et al., "Stress-Sensitive Differential Amplifiers Using Piezoresistive Effects of MOSFETs and Their Application to Three-Axial Accelerometers," Elsevier, Sensors and Actuators—A Physical; 65; pp. 61-68; 1998.

S.S. Lu et al.; "Piezoelectric field effect transistor (PEFET) using In0.2Ga0.8As/Al0.35/In0.2Ga0.8As/GaAS strained layer structure on (111)B GaAs substrate;" Electronic Letters May 12, 1994 vol. 30 No. 10; pp. 823-825.

Sharath Sriram et al.; ARNAM 2007 Annual Workshop Abstract Only, 1 page, 2007.

S. Sriram et al.; "Measurement of high piezoelectric response of strontium-doped lead zirconate titanate thin films using a nanoindenter," Journal of Applied Physics 101, 104910 (2007), pp. 101-105.

S. Sriram et al.; "The effect of post-deposition cooling rate on the orientation of piezoelectric (Pb0.92Sr0.08) (Zr0.65Ti0.35)O3 thin films deposited by RF magnetron sputtering;" Semiconductor Science and Technology 21; 2006; pp. 1236-1243.

S. Tomic et al.; "Pressure-Induced Metal-to-Insulator Phase Transitions in the Organic Conductor (2,5 DM-DCNQI) 2Cu;" Europhysics Letters, 5 (6); Mar. 15, 1988; pp. 553-558.

Scott Tyson et al.; "Nonvolatile, High Density, High Performance Phase Change Memory;" IEEE Aerospace Conf. Proceedings, 2001, pp. 385-390.

Arturas Ulcinas et al.; "Investigation of microstructure and piezoelectric properties of Zr- and Sm-doped PbTiO3 nanostructured thin films derived by sol-gel technology;" Sensors and Actuators B 109, 2005, pp. 97-101.

X. Wang et al.; "Piezoelectric Field Effect Transistor and Nanoforce Sensor Based on a Single ZnO Nanowire;" Nano Letters 2006 vol. 6, No. 12; pp. 2768-2772.

F. Xu et al.; "Longitudinal piezoelectric coefficient measurement for bulk ceramics and thin films using pneumatic pressure rig;" Journal of Applied Physics vol. 86, No. 1, Jul. 1, 1999; pp. 588-594.

Y. Yamashita et al.; "Can relaxor piezoelectric materials outperform PZT?(Review);" IEEE; 1996; pp. 71-78.

Young-Tae Kim et al.; "Study on Cell Characteristics of PRAM Using the Phase-Change Simulation;" IEEE, 2003, pp. 211-214.

A. Yukikuni et al.; "Pressure induced insulator-methal transition in hexagonal BaTi03;" Journal of Physical Society of Japan; 2004; Abstract Only; 2 pages.

* cited by examiner

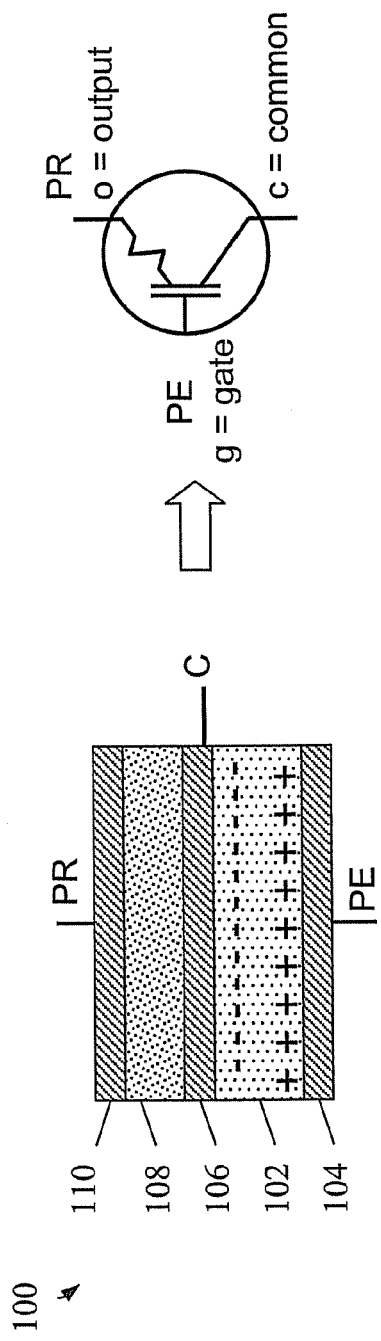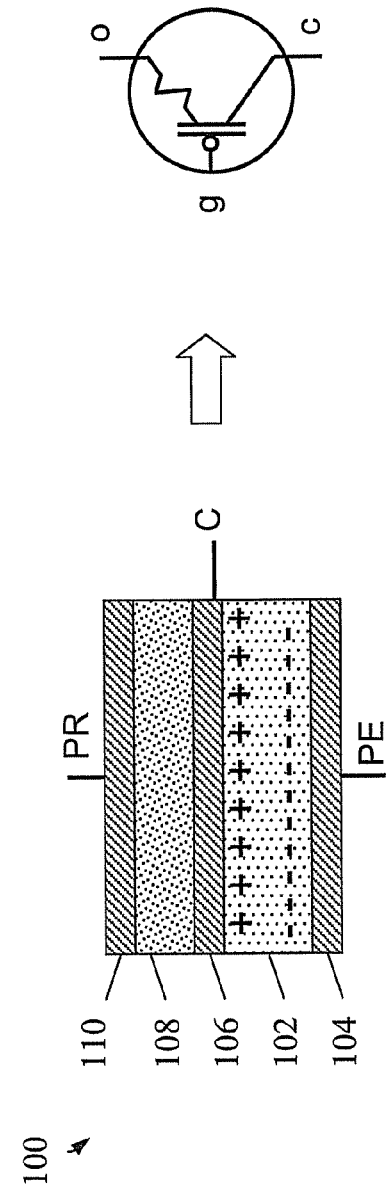
Figure 1(a)
Figure 1(b)

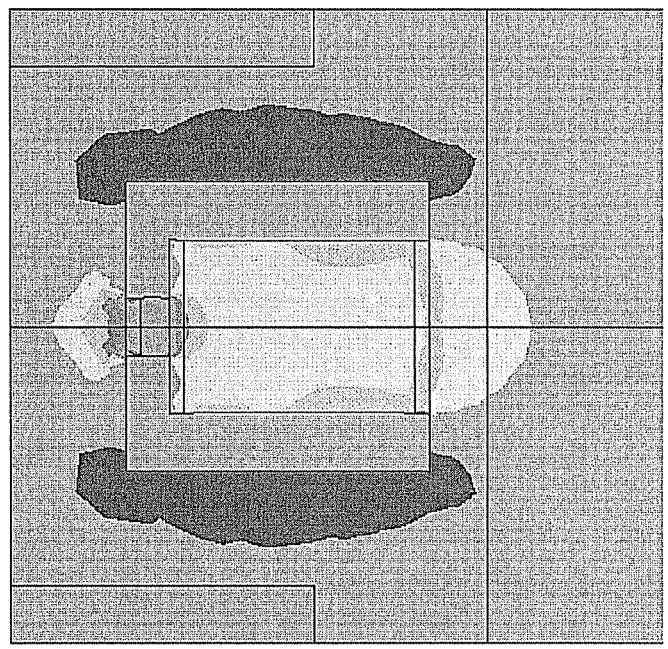
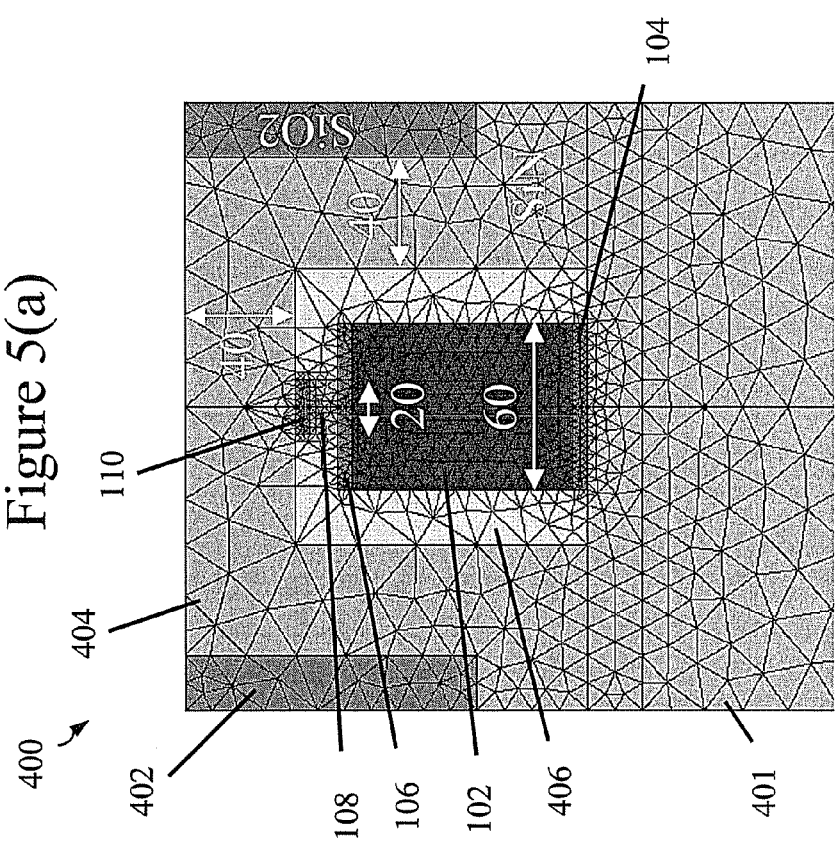
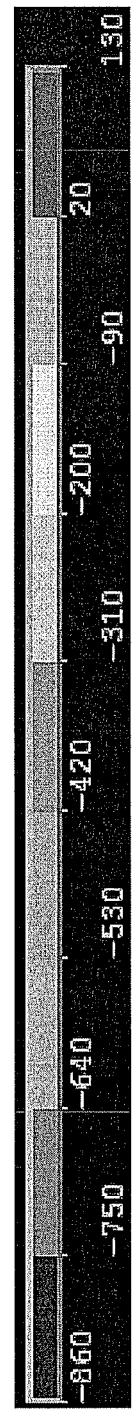
Figure 5(a)
Figure 5(b)
Figure 5(c)

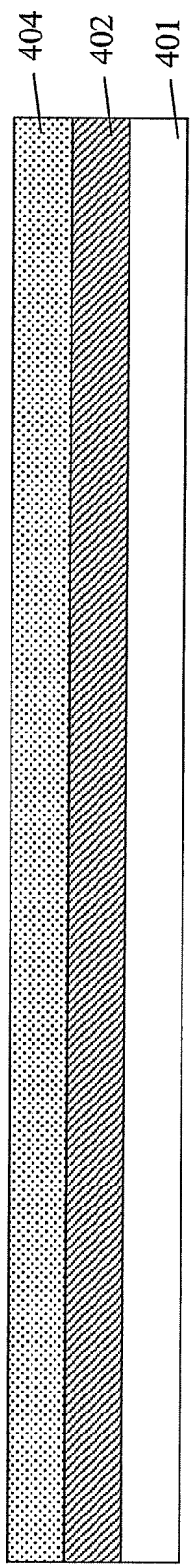
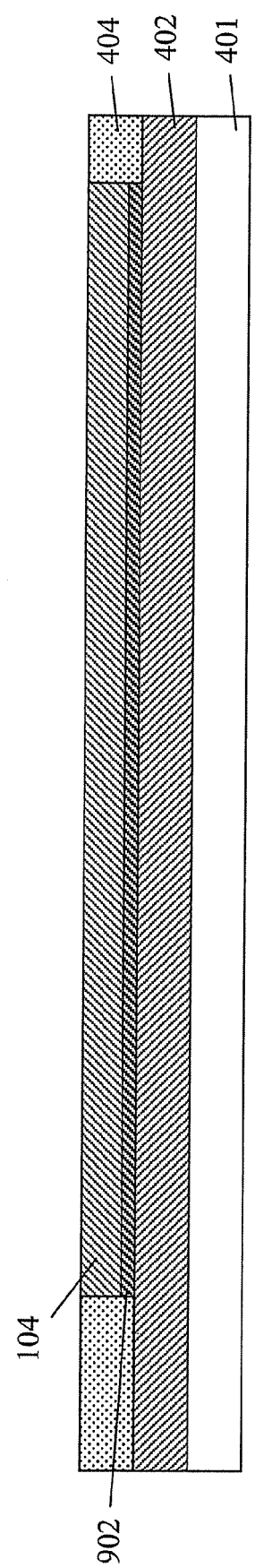
Figure 9(a)
Figure 9(b)

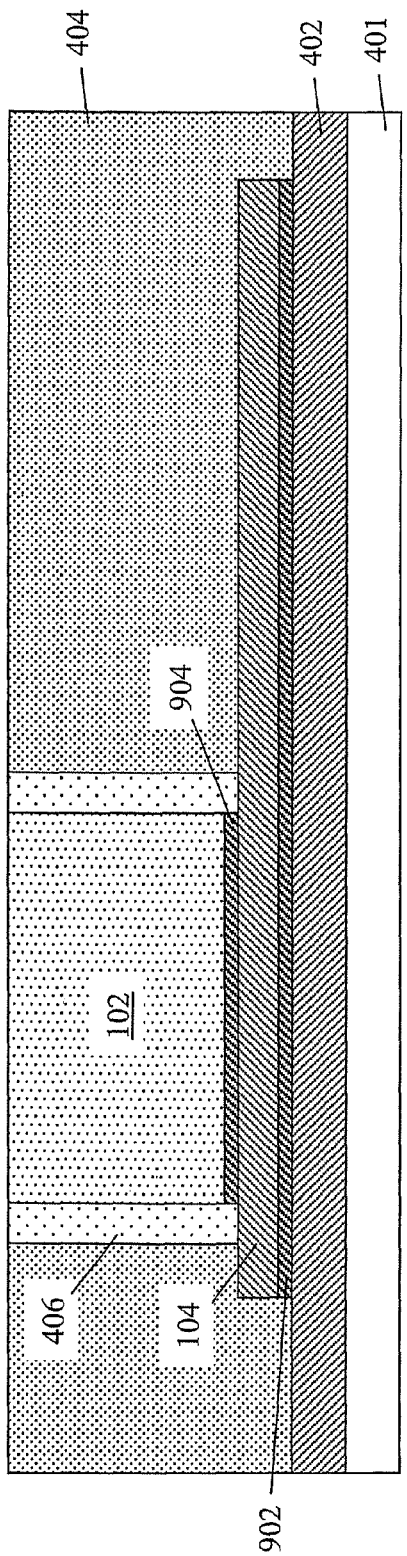
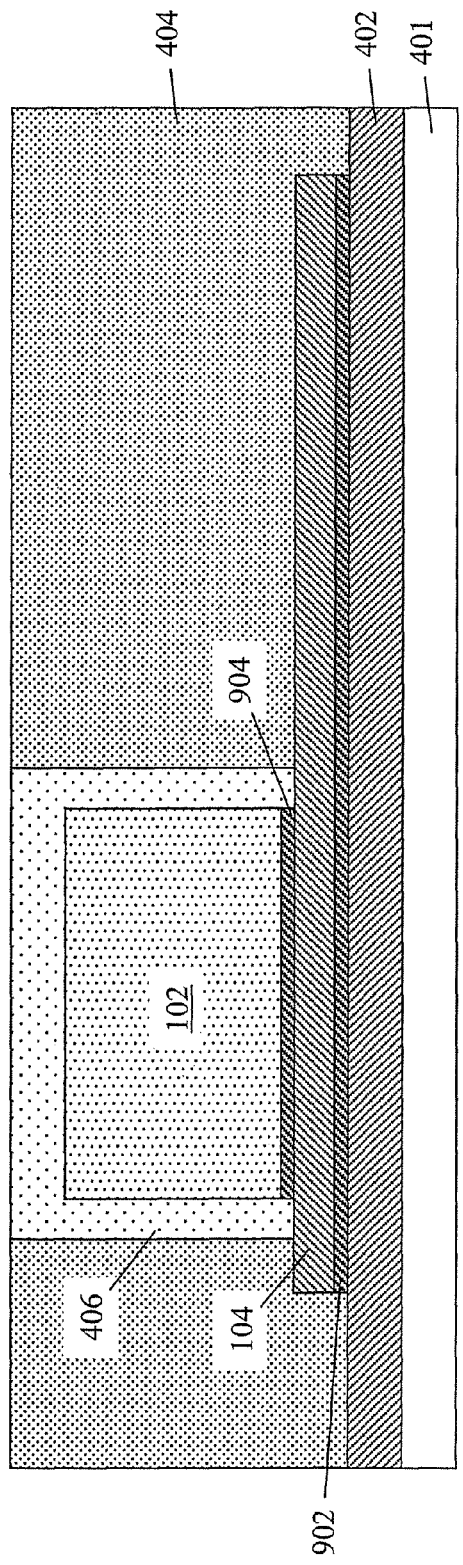
Figure 9(e)
Figure 9(f)

US 8,405,279 B2

COUPLING PIEZOELECTRIC MATERIAL GENERATED STRESSES TO DEVICES FORMED IN INTEGRATED CIRCUITS

CROSS-REFERENCE TO RELATED APPLICATION

This application is a divisional of U.S. patent application Ser. No. 12/632,154, filed Dec. 7, 2009, the disclosure of which is incorporated by reference herein in its entirety.

BACKGROUND

The present invention relates generally to integrated circuit devices and, more particularly, to coupling piezoelectric material generated stresses to devices formed in integrated circuits.

Complementary Field Effect Transistors (FETs) support the standard computer architecture (CMOS) currently used in logic and memory. FETs exploit high channel mobility to control few-carrier currents electrostatically. However, limitations in this highly successful technology are appearing at current and future device scales.

More specifically, difficulties in scalability arise from short channel effects and from few-dopant fluctuation effects. The $HfO_2$ gate oxide short channel solution brings about mobility limitations which are slowing clock speeds (Moore's Law scaling becomes negative). The unfavorable FET geometry wherein the gate capacitance corresponds to gate area, but wherein current corresponds to channel width/channel length (resulting in a speed $\sim 1/L^2$), means that the FET is a relatively high impedance device. Hence undesirably large-area FETs are required in "power hungry" applications, such as programming a PCM memory, driving long wires, or shutting down power to inactive circuit blocks.

It is desirable but very complex to build multi-layer structures in CMOS, due to the need for all FETs to be formed in single crystal silicon. A new technology in which straightforward lithographic processes can build multilayer structures could open up significant new applications such as high capacity multilayer memories and combinations of logic and memory at different levels optimized to reduce wiring length.

SUMMARY

In an exemplary embodiment, a coupling structure for coupling piezoelectric material generated stresses to an actuated device of an integrated circuit includes a rigid stiffener structure formed around a piezoelectric (PE) material and the actuated device, the actuated device comprising a piezoresistive (PR) material that has an electrical resistance dependent upon an applied pressure thereto; and a soft buffer structure formed around the PE material and PR material, the buffer structure disposed between the PE and PR materials and the stiffener structure, wherein the stiffener structure clamps both the PE and PR materials to a substrate over which the PE and PR materials are formed, and wherein the soft buffer structure permits the PE material freedom to move relative to the PR material, thereby coupling stress generated by an applied voltage to the PE material to the PR material so as change the electrical resistance of the PR material.

In another embodiment, a coupling structure for coupling piezoelectric material generated stresses within a piezo-effect transistor (PET) device formed in an integrated circuit includes a rigid stiffener structure formed around the PET device, the PET device further comprising a piezoelectric (PE) material disposed between first and second electrodes, and a piezoresistive (PR) material disposed between the second electrode and a third electrode, wherein the first electrode comprises a gate terminal, the second electrode comprises a common terminal, and the third electrode comprises an output terminal such that an electrical resistance of the PR material is dependent upon an applied voltage across the PE material by way of an applied pressure to the PR material by the PE material; and a soft buffer structure formed around the PET device, the buffer structure disposed between the PE and PR materials and the stiffener structure, wherein the stiffener structure clamps both the PE and PR materials to a substrate over which the PE and PR materials are formed, and wherein the soft buffer structure permits the PE material freedom to move relative to the PR material, thereby coupling stress generated by the applied voltage to the PE material to the PR material so as change the electrical resistance of the PR material.

In still another embodiment, a method of forming a coupling structure for coupling piezoelectric material generated stresses within a piezo-effect transistor (PET) device of an integrated circuit includes performing a first deposition of a rigid stiffener structure material over a substrate; forming a lower electrode of the PET device; performing a second deposition of the rigid stiffener structure material over the lower electrode and the first deposition of the rigid stiffener structure material; performing a first deposition of a soft buffer structure material within the second deposition of the rigid stiffener structure material, and atop the lower electrode; forming a piezoelectric (PE) material of the PET device within the first deposition of a soft buffer structure material, and atop the lower electrode; performing a third deposition of the rigid stiffener structure material over the second deposition of the rigid stiffener structure material, and performing a second deposition of the soft buffer structure material over the first deposition of the soft buffer structure material; forming a common electrode of the PET device over the PE material; performing a fourth deposition of the rigid stiffener structure material over the third deposition of the rigid stiffener structure material, and performing a third deposition of the soft buffer structure material over the second deposition of the soft buffer structure material and the common electrode; forming a piezoresistive (PR) material of the PET device within the third deposition of the soft buffer structure material, and atop the common electrode; performing a fifth deposition of the rigid stiffener structure material over the fourth deposition of the rigid stiffener structure material, the third deposition of the soft buffer structure material, and the PR material; and forming a top electrode over the PR material.

BRIEF DESCRIPTION OF THE SEVERAL VIEWS OF THE DRAWINGS

Referring to the exemplary drawings wherein like elements are numbered alike in the several Figures:

FIGS. 1(a) and 1(b) are schematic diagrams of an exemplary piezo-effect transistor (PET) device suitable for use in accordance with an embodiment of the invention;

FIGS. 5(a) through 5(c) illustrate a mechanical software pressure simulation for the PET device and coupling structure of FIG. 4;

FIGS. 9(a) through 9(l) are cross sectional views illustrating an exemplary method of forming a PET device and associated coupling structure, in accordance with a further embodiment of the invention;

DETAILED DESCRIPTION

Figure 2:
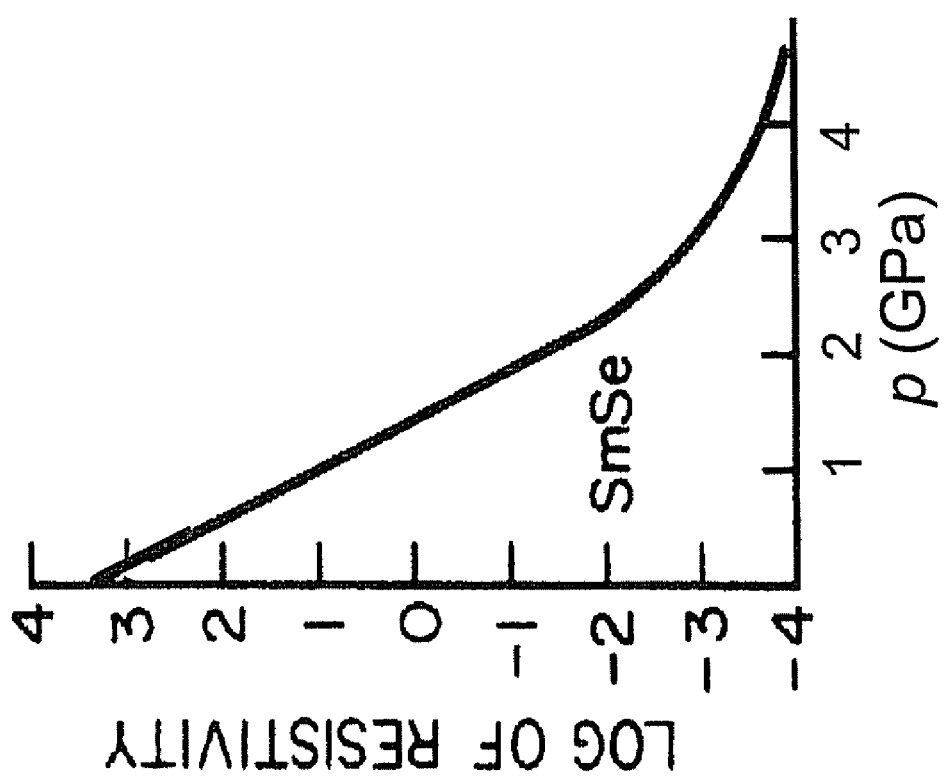
FIG. 2 is a graph that illustrates pressure versus resistance properties of samarium selenide (SmSe)

Disclosed herein is a coupling structure for coupling piezoelectric material generated stresses to actuated devices formed in integrated circuits. In exemplary embodiments, such an actuated device could be, for example, a device formed of a material that exhibits a phase change or a resistance change from an applied stress thereto originating from a piezoelectric material. One particular example of an actuated device may be a nonvolatile memory incorporating a phase change material (PCM), wherein a piezo-effect transistor has a piezoresistive material driven by a voltage-controlled piezoelectric material.

A piezoelectric (PE) material either expands or contracts, depending on the polarity of the voltage applied across it. A piezoresistive (PR) material is pressure sensitive, in that it may have a high or low resistance depending on its compression. For example, the juxtaposition of a PE material and a PR material in a way that allows the expansion and contraction of the PE material to compress and decompress the PR material results in a sensitive switch in which the resistance in the PR material can be controlled by varying the voltage across the PE material. More specifically, a three-terminal device, with one terminal connected to a thin metallic layer between the PE and PR, another to the far side of the PE and a third to the far side of the PR forms a transistor-like switch that may be used for logic and memory functionalities. Hereinafter, such a device is referred to as a piezo-effect transistor or PET.

In order to attain desired performance of such a piezo-driven device, the stress generated by application of a small voltage to the PE material should be effectively coupled to the PR/PCM so as to result in the desired resistance changes therein. Briefly stated, a coupling structure and associated process of forming the same is disclosed, wherein the coupling structure incorporates a rigid stiffener structure of a high modulus material. The high modulus material is formed around the PET the device and over the substrate (e.g., silicon) and PE/PR (or PCM) stack, while a soft (low modulus) material or air gap is disposed between the stiffener and the PET device. In operation, the stiffener structure clamps the PET device to the substrate (over which the PET is formed) so as to constrain the overall deformation of the PE and PR materials of the PET device. In addition, the soft material or air gap disposed between the PET device and the stiffener gives the PE material freedom to move relative to the other device material. In so doing, the stress generated by an applied voltage to the PE material may be effectively used to drive the PCM or piezoresistive material for high performance. Exemplary high modulus materials that may be used for the stiffener include silicon nitride (SiN) and tungsten (W), while exemplary low modulus material used for the buffer region may include a low-k material such as SiCOH, or possibly an airgap.

Prior to describing the coupling structure in greater detail, an exemplary PET device, suitable for use in accordance with embodiments of the invention, is first discussed.

Referring initially to FIGS. 1(a) and 1(b), there is shown a schematic diagram of a PET device 100 shown in an n-type configuration and a p-type configuration, respectively, along with a three-terminal symbolic representation thereof. The PET device 100 is characterized by a sandwich structure (FIG. 1), in which a PE material 102 is sandwiched between a pair of electrodes, a first of which represents a PE electrode 104 or "gate" (control) terminal and a second of which represents a common electrode 106. In addition, a PR material 108 is sandwiched between the common electrode 106 and a third electrode, which represents an output electrode 110.

In the three-terminal, 5-layered PET device 100 shown in FIGS. 1(a) and 1(b), the output electrode 110 comprises a metal layer (e.g., about 10-20 nanometers (nm) in thickness) that acts as a conductor through which significant current can be passed only if the PR material 108 is in the "ON" or low resistance state. The common electrode 106 comprises another metal layer, which is moderately flexible so as to transmit the pressure applied by the PE material 102 therebeneath. This middle metal layer acts as the common terminal for the transistor. The PE electrode or gate electrode 104 comprises another metal layer (e.g., about 10-20 nm in thickness) through which a programming voltage is applied to the PE layer 102. Thus, in the conductor/PE/conductor/PR/conductor sandwich structure, each conductor electrode also provides a barrier layer against diffusion of the PE/PR materials. As also shown in FIGS. 1(a) and 1(b), the +/− indications depict the piezo polarization to be applied to the PE layer 102 in order for the PR layer 108 to be in the low resistance "ON" state, assuming that the PR conductance increases with pressure. The sign of the response of the PE layer to a voltage across it (expansion or contraction) is set in a poling step during processing. With respect to the formation of an n-type PET (FIG. 1(a)) versus a p-type PET (FIG. 1(b)), the drive polarity is reversed by reversing the poling of the piezoelectric.

In total, an exemplary height of the PET device 100 is about 35-120 nm, with dimensions of about 45-90 nm in the x-y plane. Furthermore, the PET device 100 is scalable and many of the problems associated with conventional FET scaling are absent. For example, carrier transport is enhanced by the favorable geometry of the PET, in that current flows transversely through the thin channel film (instead of longitudinally as in the FET). In addition, there are no short-channel effects, as the input is screened from the output by the common electrode. Because the PET does not have a dopant non-uniformity problem, it should be less impurity/geometry sensitive than FETs, due to short mean free paths and efficient screening by the high density of carriers. The PET should have theoretically similar performance to that of FETs (as described in more detail below), and is capable of low ON impedance at very small scales.

Piezoelectric (PE) and Piezoresistive (PR) Materials

Figure 3A:
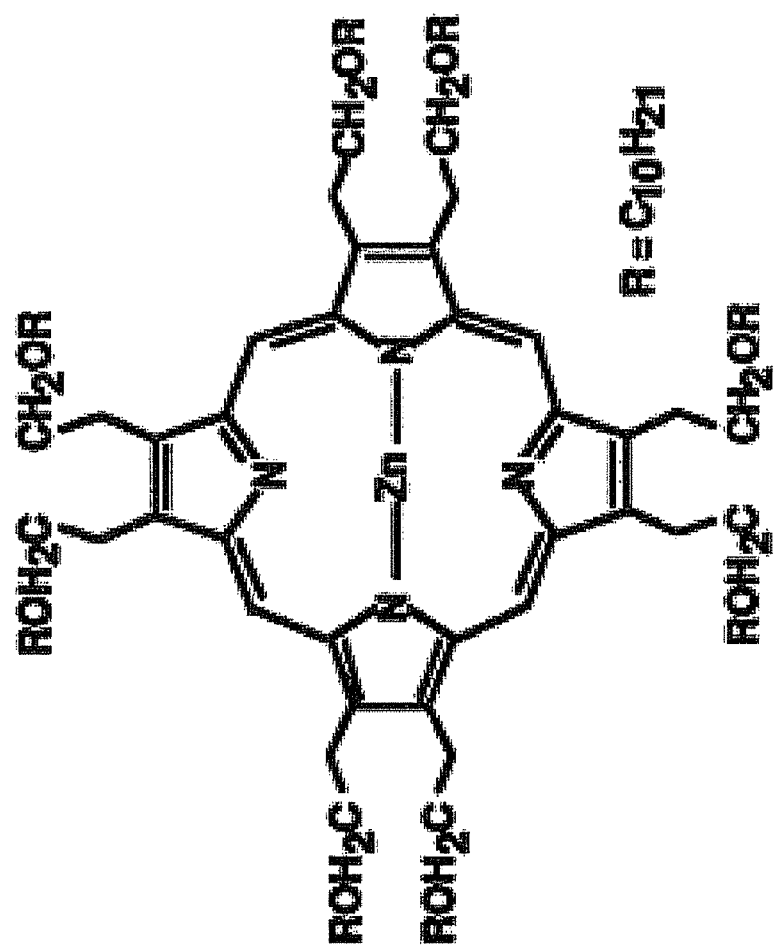
FIG. 3(a) illustrates the molecular structure of a photoconductive, porphyrin derivative known as ZnODEP.
Figure 3B:
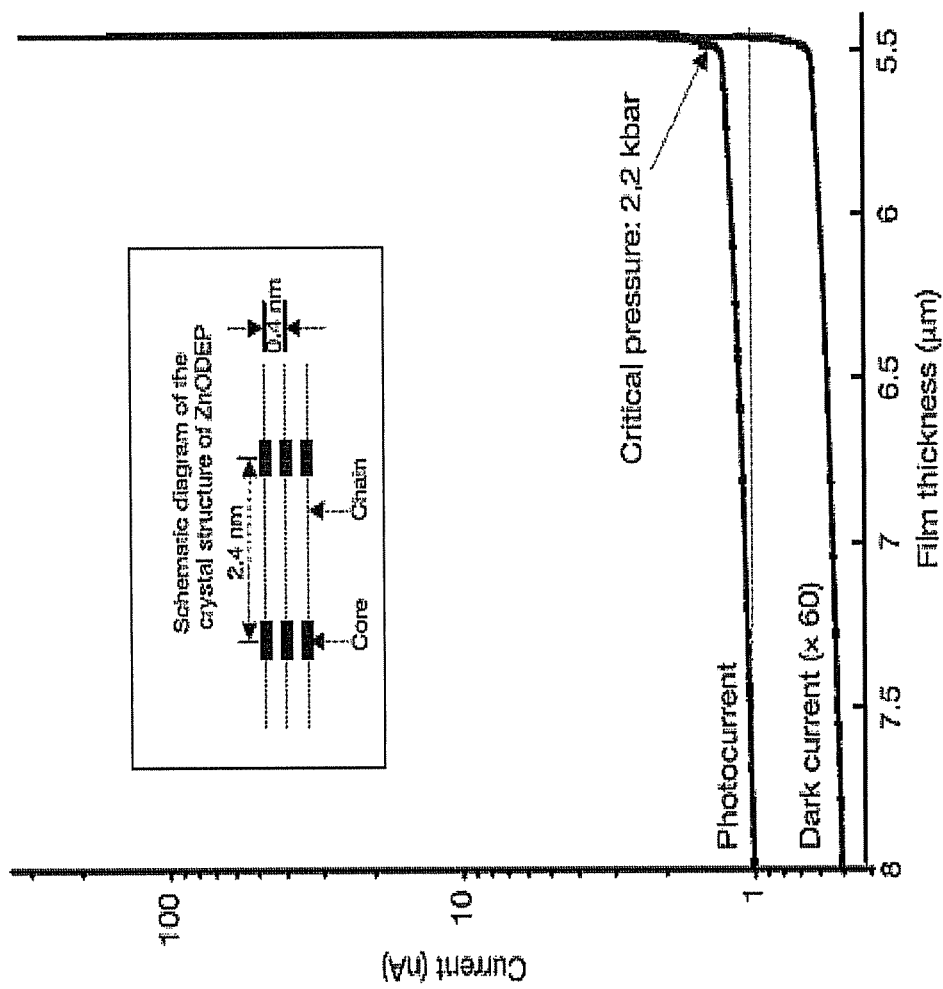
FIG. 3(b) is a graph illustrating photocurrent as a function of distance during the compression of a ZnODEP film.

FIG. 2 is a graph that illustrates pressure versus resistance properties of samarium selenide (SmSe), which is one suitable example of a PR material that may be used in the PET device. As can be seen, SmSe is a semiconductor at ordinary pressures, and continuously converts to a metallic phase under pressures of about 4 GPa, and with a substantially large conductivity change (about 5 orders of magnitude) even at about 2 GPa. While the present invention embodiments may advantageously exploit the continuous conductivity change versus pressure of materials of the SmSe type, it is also contemplated that discontinuous transition materials can also be used for the PR layer in PET device. An example of the latter type is shown in FIG. 3(a), which illustrates the molecular structure of a photoconductive, porphyrin derivative known as ZnODEP. FIG. 3(b) is a graph illustrating photocurrent as a function of distance during the compression of a ZnODEP film.

The use of continuous transition materials, such as SmSe are expected to pressurize reversibly and their transition speed may be controlled essentially by the velocity of sound, while their materials degradation due to cycling should be minimal. However, the use of materials with a discontinuous transition is also expected to be effective. Still other examples of possible PR materials that experience an insulator-to-metal transition under applied pressure include, but are not limited to: $EuNiO_3$, $Ni(S,Se)_2$, hexagonal $BaTiO_{3-\delta}$, InSb, and $(2,5\ DM\text{-}DCNQI)_2Cu$.

With respect to suitable PE materials contemplated for use in the disclosed PET device embodiments, well-known piezoelectric materials include, for example lead-zirconate-titanate (PZT), strontium-doped lead-zirconate-titanate (PSZT), PSN-PMN-PNN-PSZT, PZNT 91/9 and PMNT 70/30 [Y. J. Yamashita and Y. Hosono, Jap. J. Appl. Phys. 43, 6679-6682 (2004)] with piezoelectric coefficients ($d_{33}$) lying in the range of about 200-1500 pm/V.

PET with Coupling Structure

Figure 4:
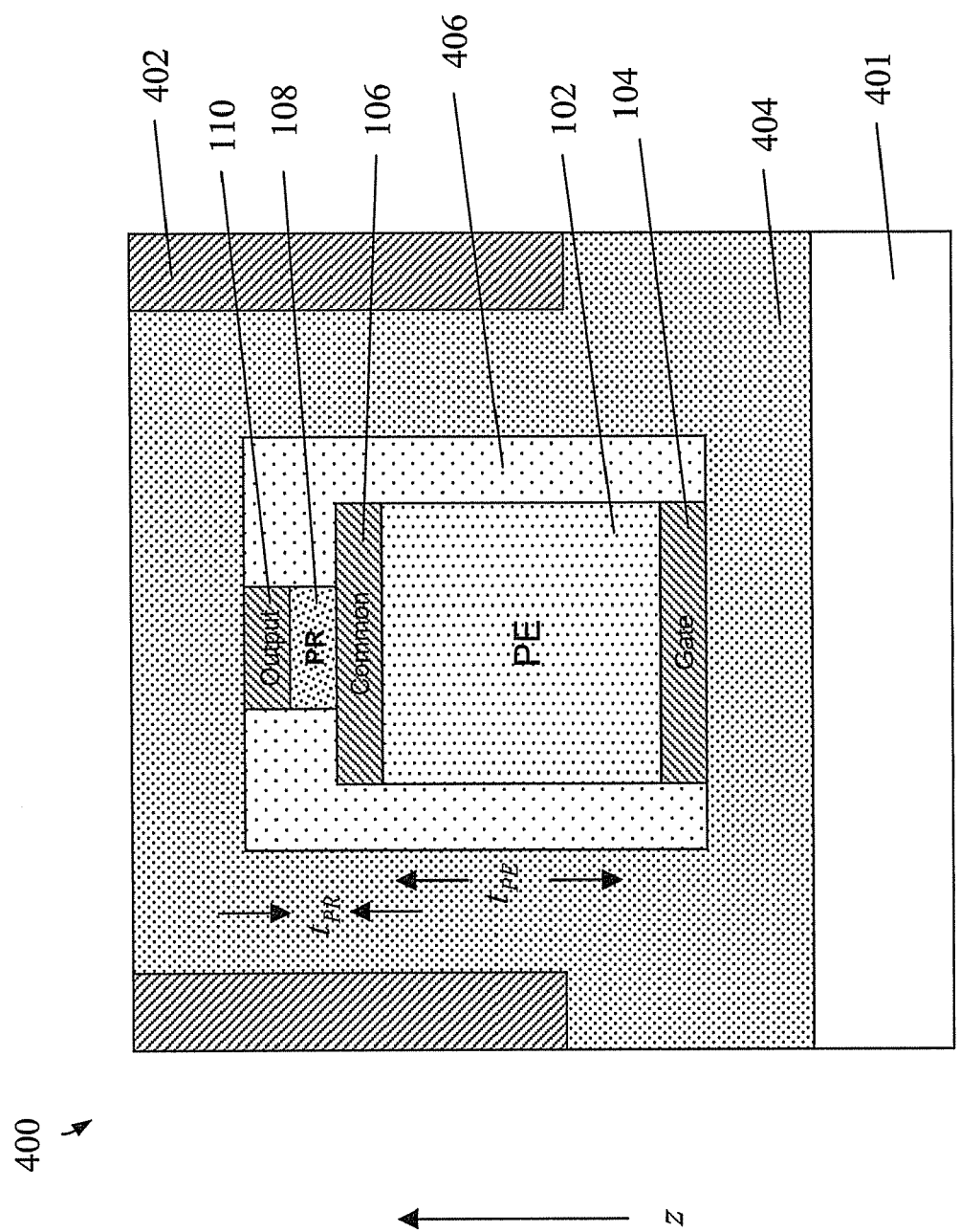
FIG. 4 is a schematic cross-sectional diagram of another embodiment of a PET device having a coupling structure for coupling piezoelectric material generated stresses to a PCM or PR portion of the PET device, in accordance with an embodiment of the invention.

Referring now to FIG. 4, there is shown a schematic cross-sectional diagram of another embodiment of a PET device with an associated coupling structure, generally indicated at 400. For purposes of simplicity, like reference numbers from PET elements described in FIGS. 1(a) and 1(b) are used in subsequent figures. It will be noted that the cross-sectional area of the PR element 108 in the illustrated embodiment is less than that of the PE element 102. As is also shown in FIG. 4, the PET device (including PE element 102, PR element 108, and electrodes 104, 106, 110) is formed over a substrate 401, such as silicon for example. Insulating regions 402 (such as silicon dioxide ($SiO_2$) for example) are also shown for purposes of illustration.

It should be noted, however, that although the described exemplary embodiment illustrates a silicon substrate, other substrates might also be utilized, so long as fabrication of the PET device and associated coupling structure is compatible with traditional CMOS back-end-of-line processes. While the fabrication could also be compatible with traditional CMOS front-end-of-line processes as well (for example, in the illustrated embodiment where the substrate 401 is silicon), again such a device could alternatively be made using CMOS back-end-of-line processes only where substrates other than silicon are used.

As further shown in FIG. 4, the PET device is surrounded by a coupling structure that includes a stiffener structure 404, formed from a high Young's modulus (E) material, such as silicon nitride ($Si_3N_4$) or tungsten (W) for example. In an exemplary embodiment, a high Young's modulus material may be on the order of about 60 gigapascals (GPa) or greater, and more specifically on the order of about 100 GPa or greater. Such a relatively high value of E ensures that the piezoelectric displacement of the PE element 102 is transmitted to the PR element 108, rather than to a surrounding medium such as insulating regions 402 or the substrate 401. Disposed between the stiffener structure 404 and the PET device is a soft (low Young's modulus) material spacer 406 or, alternatively, an air gap. The soft spacer material 406, in an exemplary embodiment has a low Young's modulus on the order of about 20 GPa or less, and more specifically on the order of about 10 GPa or less. Such a material may be, for example, SiCOH.

In operation, the stiffener structure 404 clamps the PET device to the substrate 401 (over which the PET is formed) so as to constrain the overall deformation of the PE and PR materials 102, 108, respectively of the PET device. In addition, the soft material spacer 406 or air gap disposed between the PET device and the stiffener structure 404 gives the PE material 102 freedom to move relative to the other device material.

Considering for simplicity only the z-component of electric field and stress/strain, and assuming rigid mounting of the top and bottom surfaces of the device 400 in FIG. 4, then the pressure rise $p_{PR}$ across the PR element 108 due to a field $E_z$ across the PE element 102 in the z-direction is given by the expression:

$$p_{PR} = E_z d_{33} \bigg/ \left[ \frac{A_{PR}}{A_{PE} E_{PE}} + \frac{t_{PR}}{t_{PE} E_{PR}} \right], \quad \text{(Eq. 1)}$$

wherein $E_z$ is the electric field in the z-direction, E denotes the Young's modulus of the given element ($E_{PR}$ or $E_{PE}$), t denotes film thickness of the given element ($t_{PR}$ or $t_{PE}$) parallel to the z-axis, A denotes surface area of the given element ($A_{PR}$ or $A_{PE}$) normal to the z-axis, and $d_{33}$ denotes the zz-component of the piezoelectric coupling coefficient of the PE material. Using exemplary values of $E_{PR}=E_{PE}\approx 40$ GPa, $t_{PR}/t_{PE}\approx 1/5$, an area ratio $A_{PR}/A_{PE}\approx 1/4$, $d_{33}=0.6$ nm/V, and a reasonable electric field of 0.02 V/nm, the pressure rise is about 1 GPa. The applied voltage will be about 1 volt, with a PE thickness of $t_{PE}=50$ nm. As will be seen from the more detailed simulations discussed below, 0.6 GPa may be reached (drive voltage 1.6 V), using a piezoelectric with $d_{33}=0.37$ nm/V, which will scale up to 1.5 GPa using a PE material such as PSN-PMN-PNN-PSZT with $d_{33}=0.94$ nm/V. In contrast, using an organic PR material such as ZnODEP, only pressures on the order of about 0.22 GPa are needed, and low-power operation at drive voltages as low as 0.24 V is possible.

Simulation of the Pressure Cell

Referring now to FIG. 5(a), the exemplary PET with associated coupling device 400 is configured for a mechanical simulation, using engineering simulation software from ANSYS, Inc. The exemplary distances shown in FIG. 5(a) are in nanometers. Again, in addition to the 5-layer structure of the PET cell itself, the simulated structure 400 also includes a silicon substrate 401, a soft spacer material (e.g., SiCOH or other process-compatible soft material) buffer structure 406 surrounding the cell, a silicon nitride (SiN) clamp or yoke stiffener structure 404 on the substrate 401 surrounding the transistor, and silicon dioxide ($SiO_2$) regions 402 within the SiN stiffener structure 404. The simulation material for the three metal layers 104, 106, 110 of the cell structure is tungsten (W), and the simulation material for the PE material 102 is Lead Zirconate Titanate (PZT-5A), with $d_{33}=0.37$ nm/V.

The dimensions are defined by $t_{PE}=80$ nm, $t_{PR}=10$ nm, $A_{PE}=3600$ nm$^2$, $A_{PR}=400$ nm$^2$.

The nitride stiffener structure 404 forms a rigid frame so that the electrically induced displacement of the PE material 102 is mechanically coupled to (and focused primarily towards) the PR material 108. Tungsten forms the conducting electrodes (leads not shown), and is also mechanically rigid, while the low-K buffer structure 406 (being a soft material) does not impede the operating displacements significantly.

FIG. 5(b) shows the stress distribution of the simulated structure 400 when 1.6 V is applied to the PE material 102 with a resulting electric field of 0.02 V/nm. It is noted that a contraction (tension) of the PE element 102 results in an expansion (negative pressure) of the PR element 108 and vice-versa. It will be seen from FIG. 5(b) that the PE material 102 expands at its sides (due to its Poisson ratio), and exerts pressure at both the top and bottom sides thereof due to its voltage-induced expansion. Due to some degree of force concentration, the highest pressure is in the PR material 108, as reflected in FIG. 5(b), and the pressure legend of FIG. 5(c).

Figure 6:
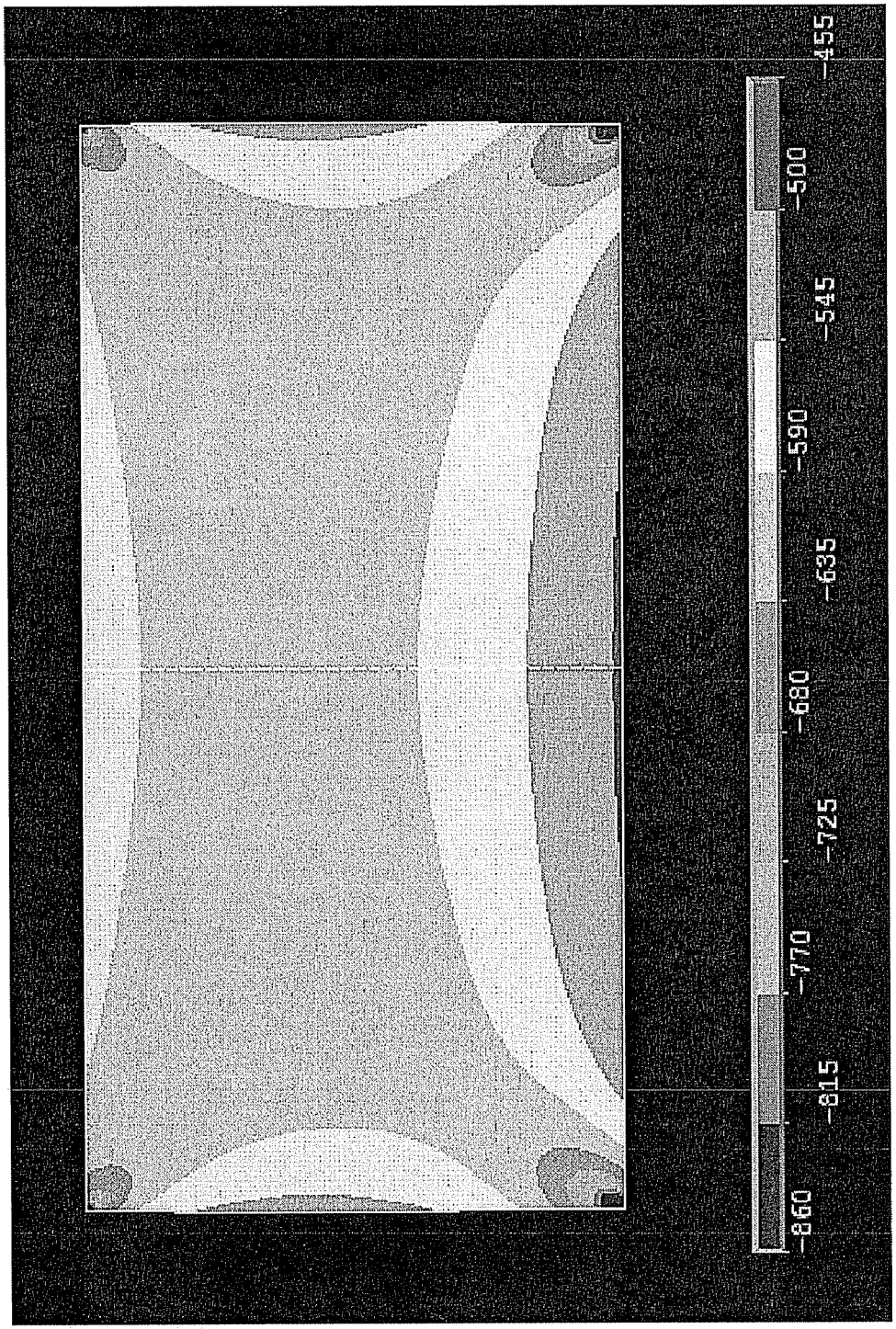
FIG. 6 is a more detailed view of the simulated pressure distribution within the PR material.
Figure 7:
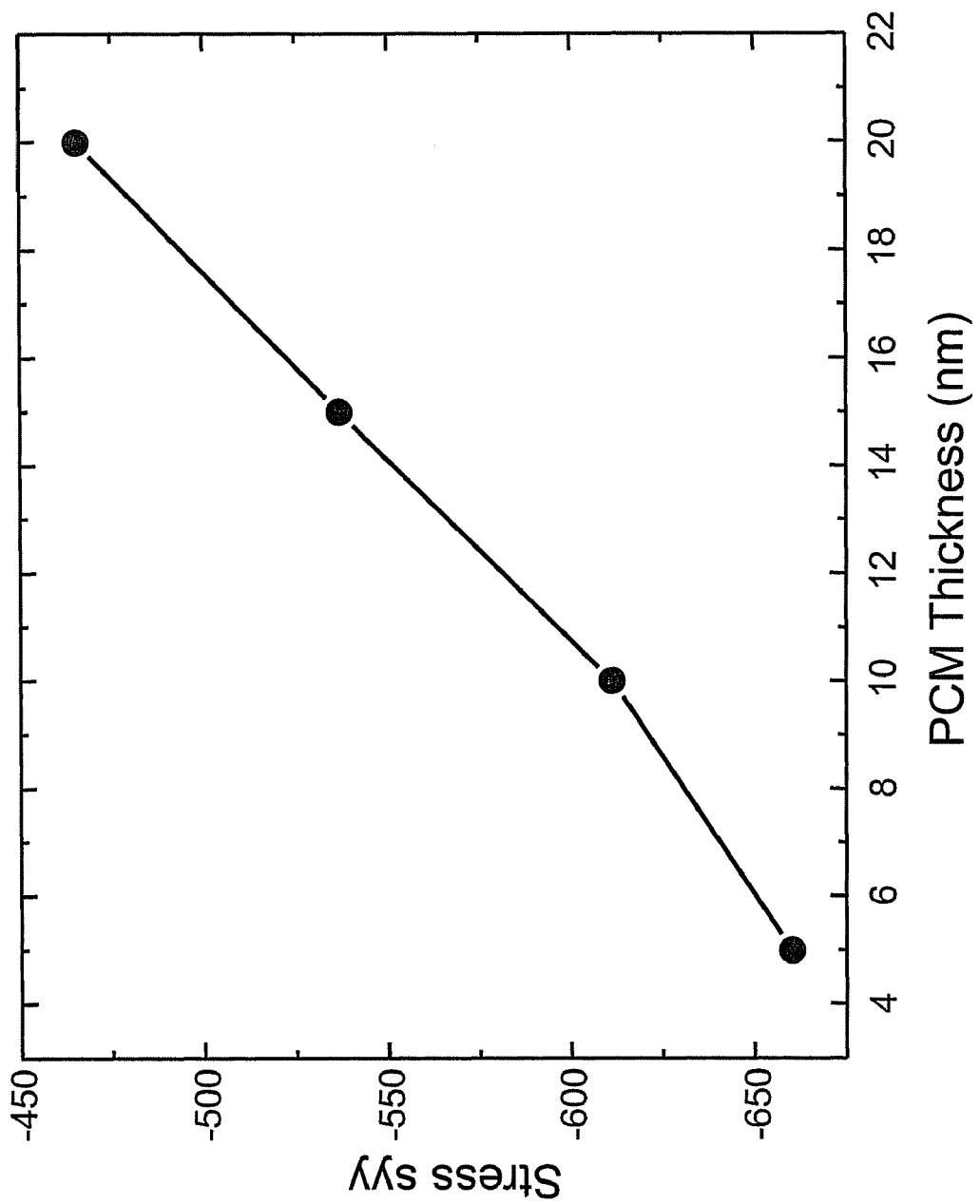
FIG. 7 is a graph illustrating the dependence of pressure on PCM or PR material thickness.

FIG. 6 is a more detailed view of the simulated pressure distribution within the PR material 108. As will be noted, the pressure is seen to be fairly uniform therein, and on the order of about 0.6 GPa. FIG. 7 is a graph illustrating the dependence of this pressure on PR (PCM) material thickness, which is not critical. If the results are scaled to a PE material with $d_{33}=0.94$ nm/V, pressure of 1.5 GPA, in the acceptable regime, is obtained.

Figure 8B:
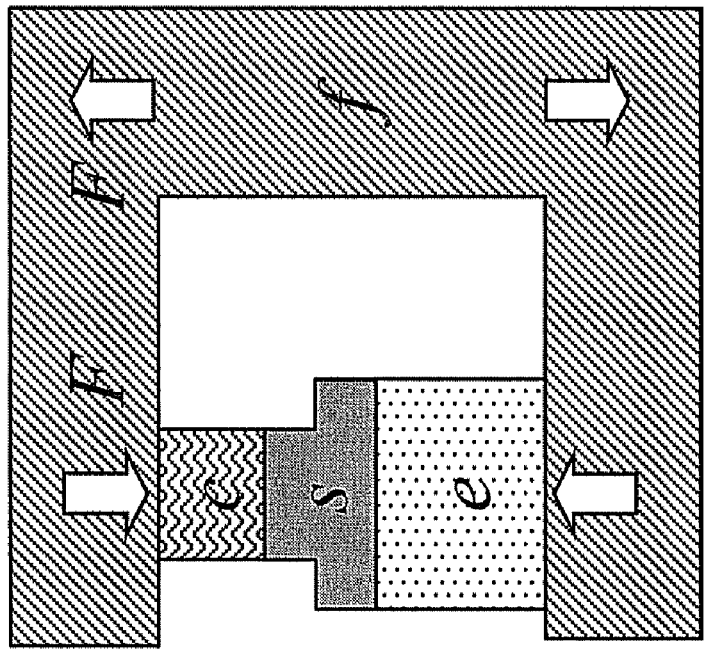
FIGS. 8(a) and 8(b) are cross sectional views illustrating a mechanical model of a C-shaped coupling structure used to couple piezo-generated stress to the PR layer.
Figure 8A:
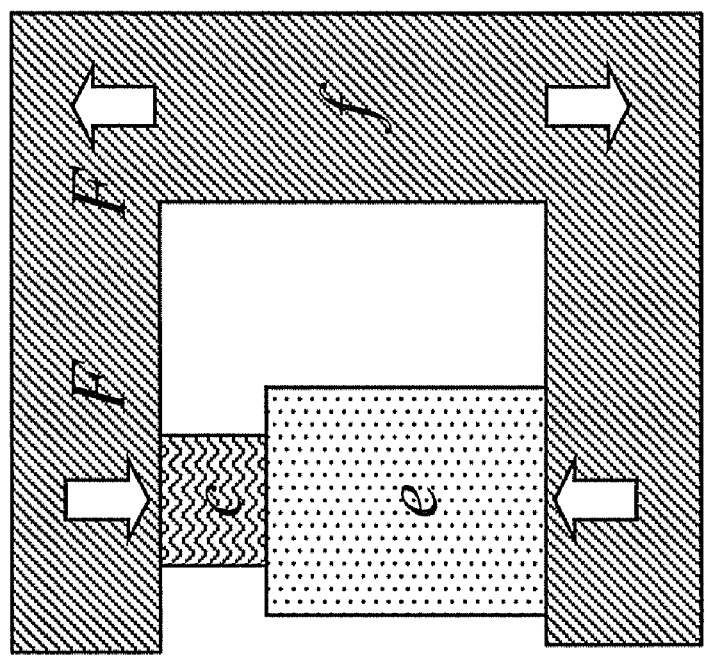

With respect to the clamping stiffener structure 404 used to couple piezo-generated stress to the PR layer, a simple mechanical model which aids in further understanding of the operation of the pressure cell is shown in FIG. 8(a). The model only considers compressive stresses/strains. The parameters for the model include: F=force, L=length, A=area, Y=Young's modulus, u=displacement, k=stiffness, E=electric field, and σ=stress. Coefficients/subscripts used in the model include: f=frame/clamp, c=PR, e=(piezo element). The mechanics of a C-shaped clamp as shown in FIG. 15(a) are in accordance with the following expressions:

$$F = \sigma A = \frac{YA}{L}u \quad \text{(Eq. 2)}$$

$$k = \frac{F}{u} = \frac{YA}{L} \quad \text{(Eq. 3)}$$

$$d_{33}E_3L_e = u_e + u_c + u_f \quad \text{(Eq. 4)}$$

$$\sigma_c = \frac{F}{A_c} = \frac{d_{33}E_3L_e}{A_c(k_e^{-1} + k_c^{-1} + k_f^{-1})} = \frac{d_{33}E_{33}}{\frac{1}{Y_e}\frac{A_c}{A_e} + \frac{1}{Y_c}\frac{L_c}{L_e} + \frac{1}{Y_f}\frac{L_f}{L_e}\frac{A_c}{A_f}} \quad \text{(Eq. 5)}$$

If the second two terms in the denominator of the expression of Eq. 5 for the stress $\sigma_c$ in the PR material can be for the moment ignored, then the pressure in the PR material would be multiplied by the ratio of the areas $A_e/A_c$ of the piezo to the PCM, the force concentrator effect described above. The second term describes the relative mechanical response of the piezo and PR elements, and the third the effect of the mechanical response of the environment (modeled as a C-clamp). There is a bending effect in the horizontal arms of the clamp, which is ignored here. In order to achieve high strain ($\sigma_c/Y_c$) in the PR material (strain is a dimensionless measure of the ability to drive a phase transition), it is desirable that the PR material be soft relative to the piezo and environment, that the concentrator area ratio $A_e/A_c$ be large, that the piezo be thicker than the PR material, and that the environment have a "robust" aspect ratio (wider vs. taller), while the sample be the reverse (taller vs. wider). FIG. 8(b) illustrates a similar analysis, only with the insertion of a hard (e.g., tungsten) T-shaped force concentrator (s) between the piezo element and the PR material. This type of structure may be desirable in the event that the force concentrator area ratio is so large as to risk significant bending distortion in the driver structure. In this example, the applied stress to the PR material is in accordance with the following expression:

$$\sigma_c = \frac{F}{A_c} = \frac{d_{33}E_3L_e}{A_c(k_e^{-1} + k_c^{-1} + k_f^{-1} + k_s^{-1})} = \quad \text{(Eq. 6)}$$

$$\frac{d_{33}E_3}{\frac{1}{Y_e}\frac{A_c}{A_e} + \frac{1}{Y_c}\frac{L_c}{L_e} + \frac{1}{Y_f}\frac{L_f}{L_e}\frac{A_c}{A_f} + \frac{A_c}{L_e}\frac{1}{k_s}}$$

Thus, to maximize the stress in the PR material, the force concentrator(s) is made stiff, the PR material is made small and/or the piezo element is made large.

Physical Implementation and Manufacture

Figure 9C:
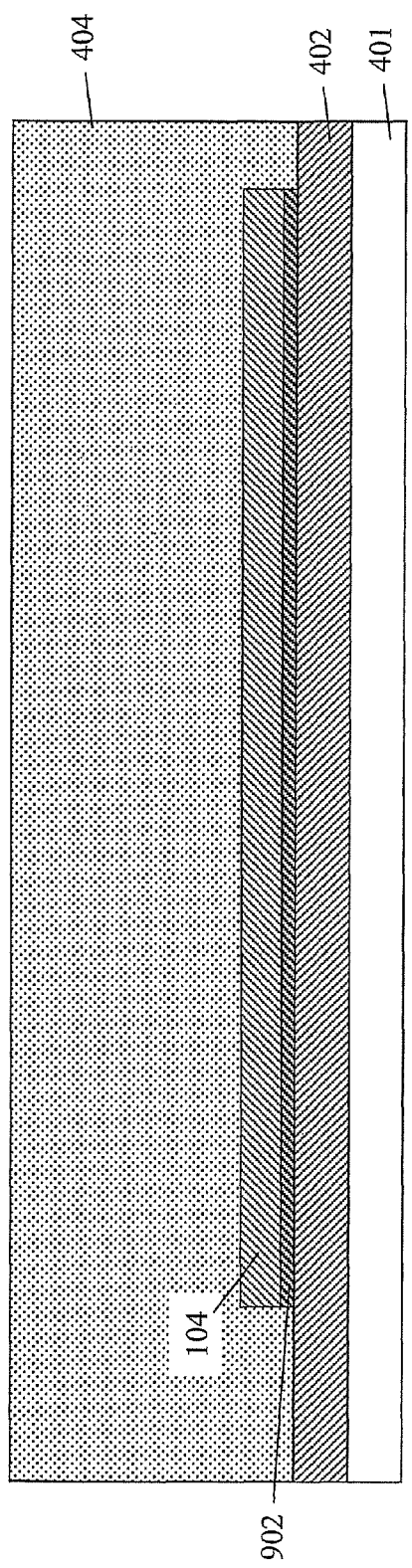

FIGS. 9(a) through 9(l) are cross sectional views illustrating an exemplary method of forming a PET device and coupling structure as depicted in FIG. 4. The exemplary method described herein is fully compatible with existing CMOS processing techniques. As shown in FIG. 9(a), a substrate 401 (e.g., silicon) has an insulating layer 402 (e.g., SiO2) formed thereon, followed by a first deposition of stiffener material 404 (e.g. SiN) that will form the final stiffener structure for the PET device. In FIG. 9(b), a portion of the stiffener material 404 is lithographically patterned and removed to define the location of the lower electrode of the PET device. More specifically, FIG. 9(b) illustrates a diffusion barrier layer 902 (e.g., Ti/TiN) formed over the insulating layer 402, followed by deposition and/or plating of the electrode metal (e.g., W, Cu) and chemical mechanical polishing (CMP) as known in the art to form the lower electrode 104.

Figure 9D:
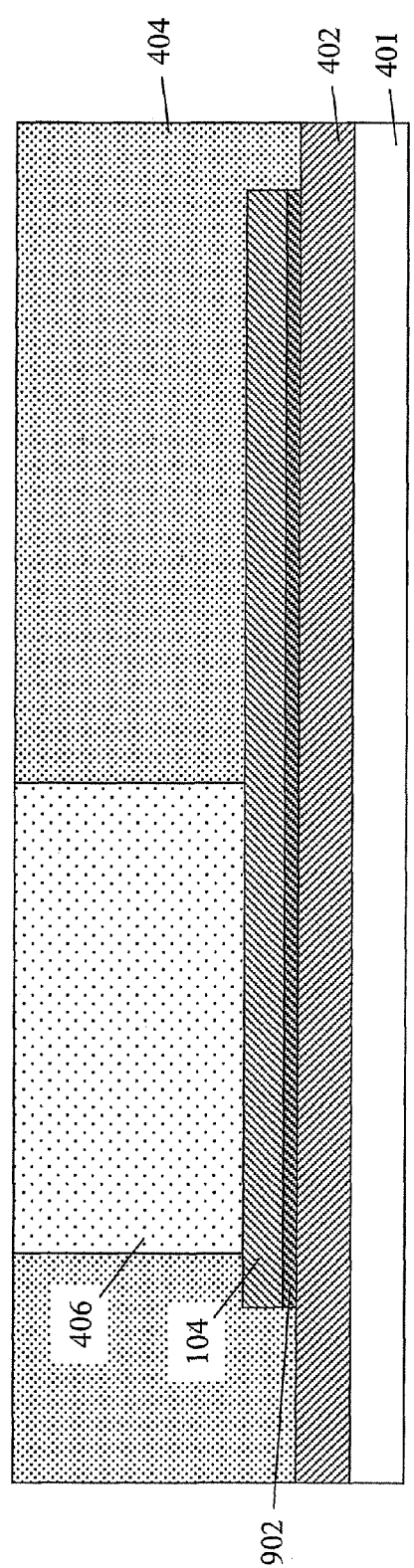

As then shown in FIG. 9(c), a second deposition of SiN stiffener material 404 covers the lower electrode 104, to a thickness roughly corresponding to the height of the PE material for the PET device. As shown in FIG. 9(d), a patterning step is used to open a portion of the stiffener material down to the top of the lower electrode 104, followed by deposition and CMP of the soft buffer structure material 406 that will surround the PET cell. Again, in an exemplary embodiment, the soft buffer structure material is SiCOH, although an air gap could also be used, for example. As shown in FIG. 9(e), another patterning step is then used to open the buffer structure material 406 for the formation of another diffusion barrier layer 904 and PE material (e.g., PSZT) 102 thereupon.

Figure 9G:
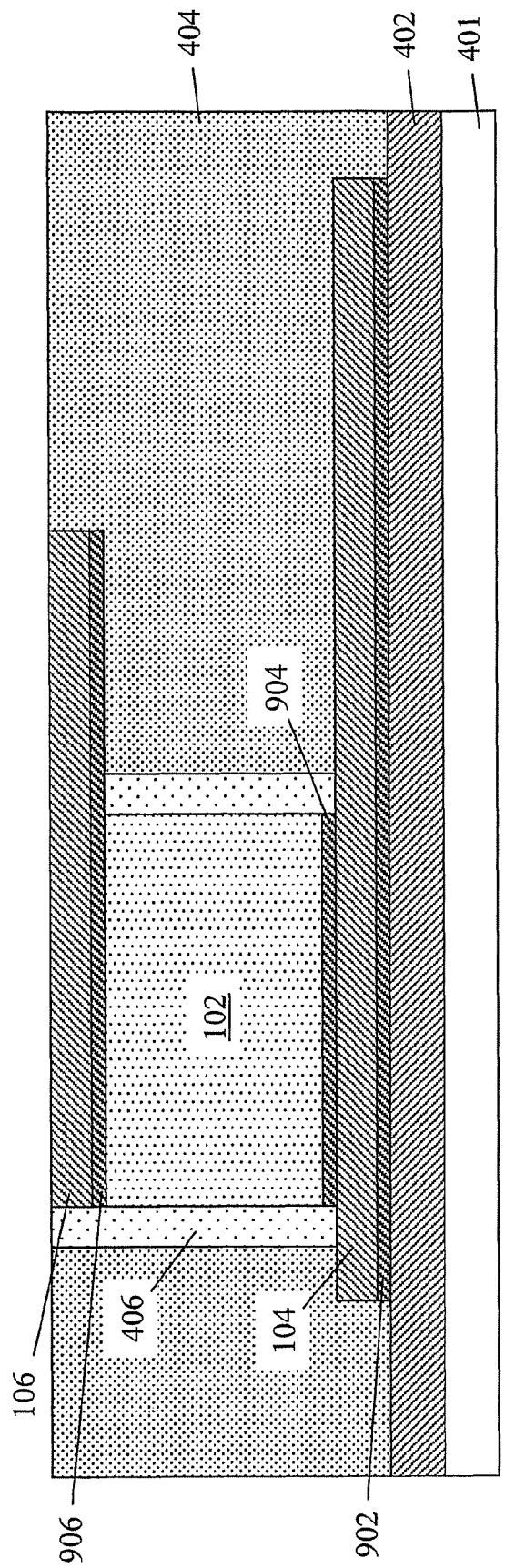

Referring now to FIG. 9(f), a third deposition of SiN stiffener material 404 builds additional height roughly corresponding to the thickness of the common electrode for the PET device. This additional SiN is then patterned and opened so as to allow deposition and CMP of additional soft buffer structure material 406 above the PE material 102, as also shown in FIG. 9(f). Then, as shown in FIG. 9(g), portions of the soft buffer structure material 406 and the SiN stiffener material 104 are patterned and removed so as to facilitate deposition and/or plating of another diffusion barrier layer 906 and metal for the common electrode 106.

Figure 9H:
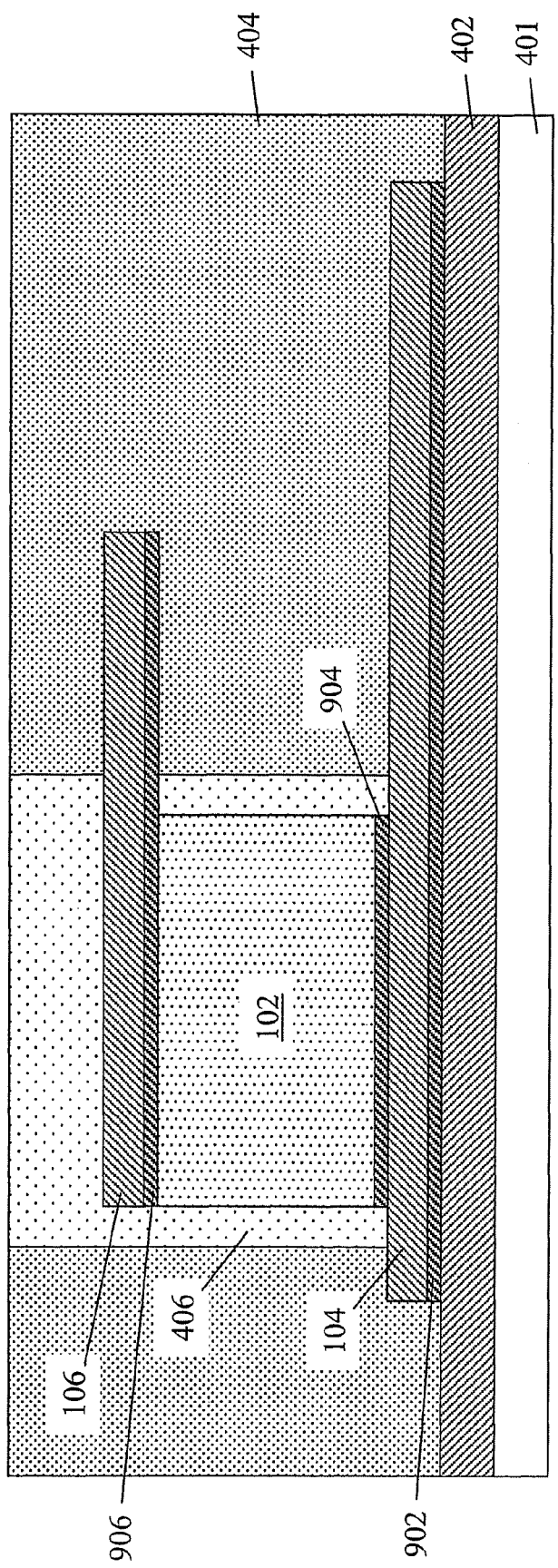
Figure 9I:
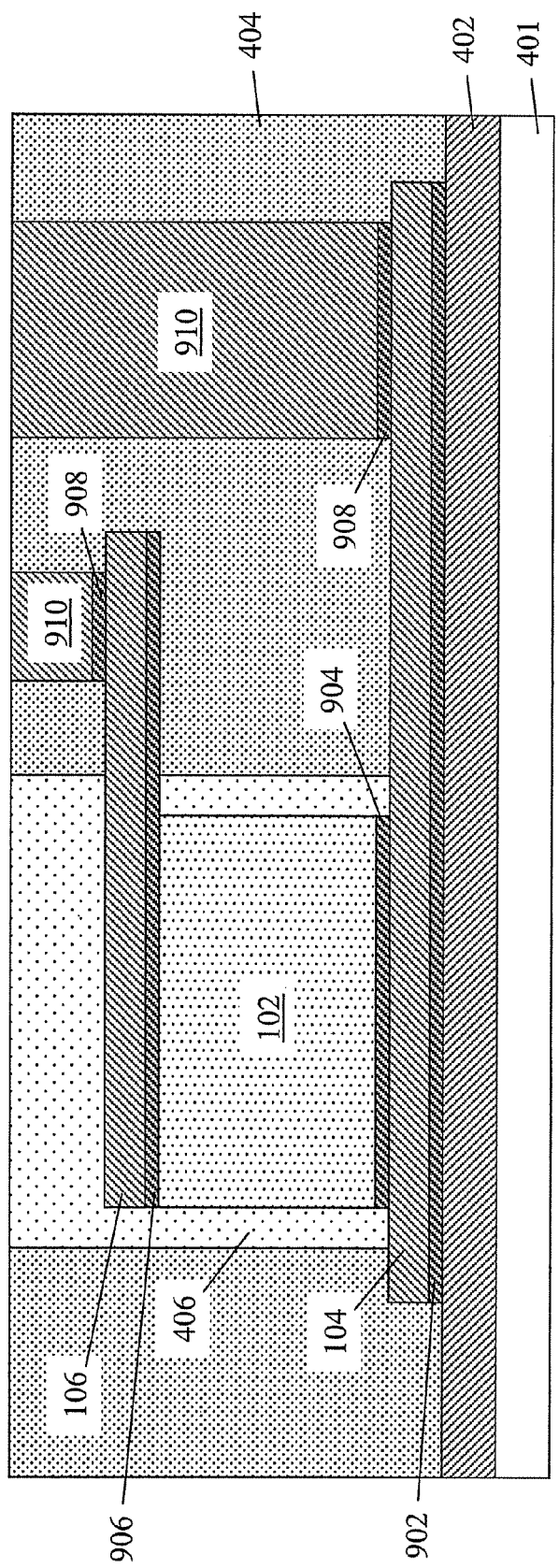
Figure 9J:
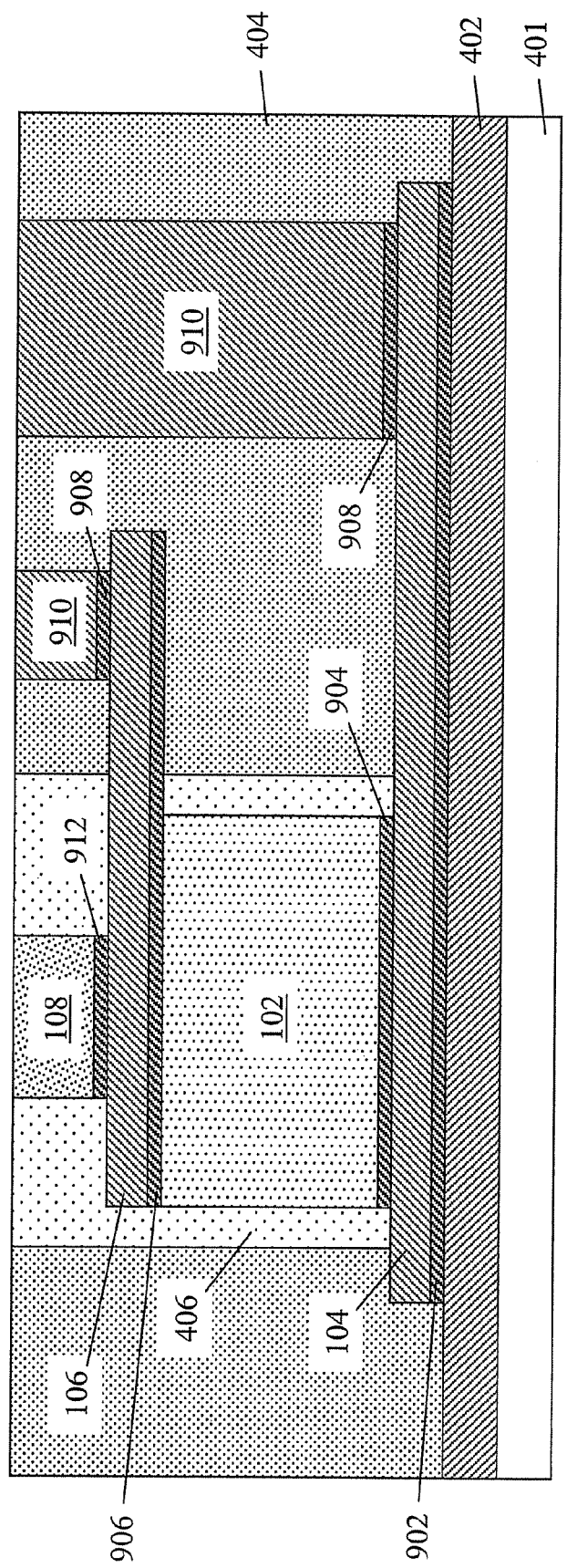

Proceeding to 9(h), a fourth deposition of SiN stiffener material 404 builds additional height roughly corresponding to the thickness of the PR phase change material of the PET device. This additional SiN is then patterned and opened so as to allow deposition and CMP of additional soft buffer structure material 406 above the common electrode 106, as also shown in FIG. 9(h). At this point, a patterning step may then be performed so as to form vias for contacting the bottom and common electrodes 104, 106. As particularly illustrated in FIG. 9(i), barrier layers 908 and conductive studs (e.g., W filled vias) 910 are formed in contact with bottom and common electrodes 104, 106. Then, as shown in FIG. 9(j), another patterning step is used to define an opening in the uper portion of the soft buffer structure material 406, followed by formation of a barrier layer 912 and the PR element 108 over the common electrode 106. The PR element 108 may comprise a stack of materials such as, for example, SmSe, SmS, etc. The PR element 108 or a metal/PR stack may also include an intervening liner layer to the PR material (such as Ti, for example) to ensure good mechanical adhesion. This PR material is shown planarized in FIG. 9(j) prior to formation of a top contact thereto.

Figure 9K:
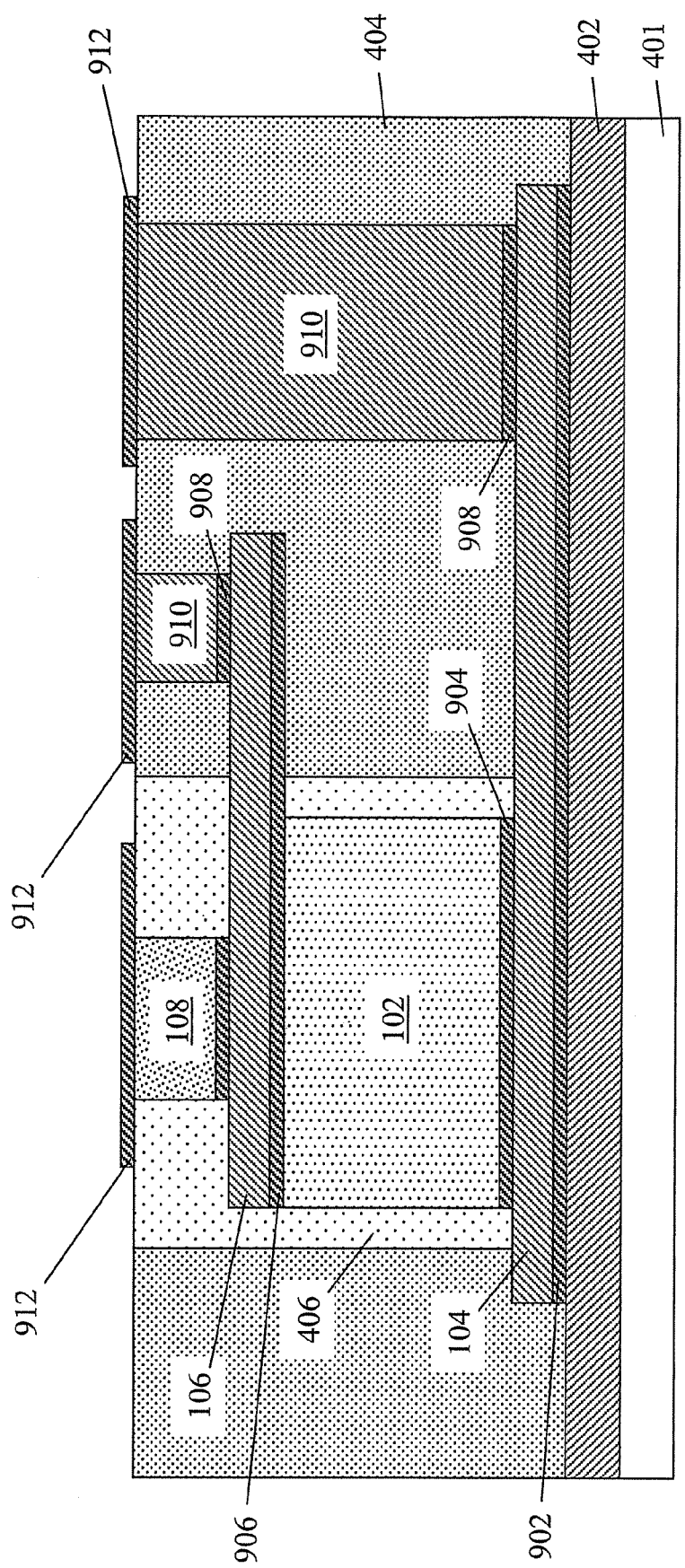
Figure 9L:
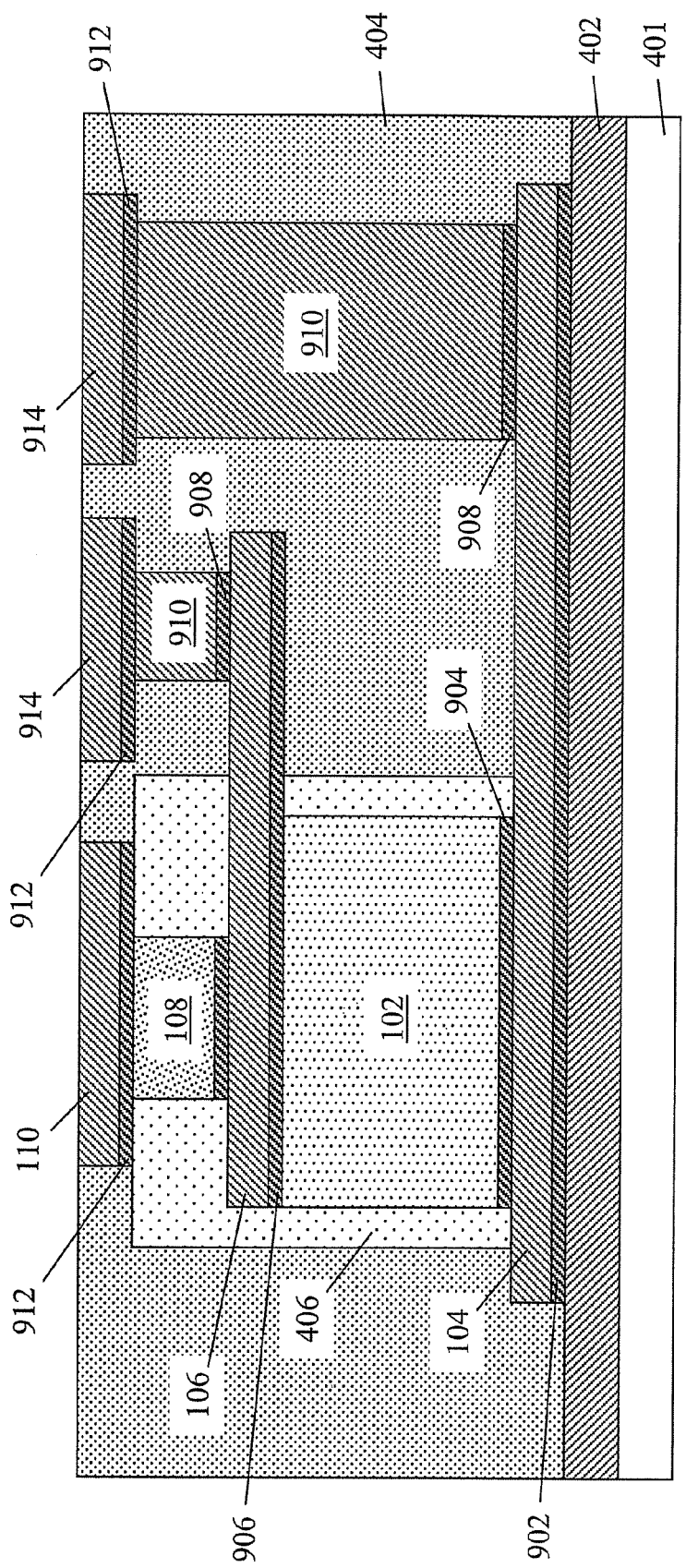

In FIG. 9(k), another diffusion barrier layer 912 is deposited and patterned so as to contact PR element 108, as well as the common and lower electrode studs 910. Finally, as shown in FIG. 9(l), a fifth deposition of SiN stiffener material 404 over the diffusion barrier layer 912 builds additional height roughly corresponding to the thickness of the top electrode for the PET device. This additional SiN is then patterned and opened so as to allow deposition and CMP of metal that forms the top electrode 110 of the PET device, as well as electrodes 914 contacting the studs 910. From this point, additional CMOS device processing as known in the art may continue.

For example, as described and illustrated in further detail below, a capping layer (not shown in FIG. 9(l)) may be formed over the device. In the event that an air gap or vacuum is desired to be the buffer material, then such a capping layer may be opened though one or more access holes such that the soft buffer structure material 406 can be etched out. In such a case, the soft buffer structure material 406 would constitute a sacrificial material.

Figure 10A:
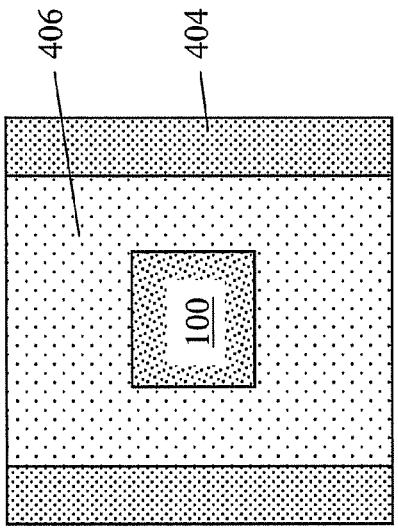
FIGS. 10(a) through 10(e) are top down, cross sectional views illustrating exemplary sidewall arrangements of the stiffener structure, in accordance with further embodiments of the invention.
Figure 10B:
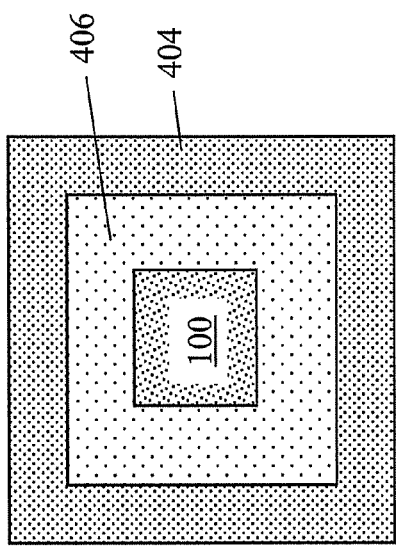
Figure 10C:
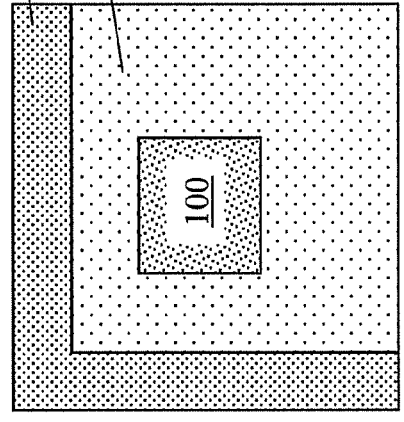
Figure 10D:
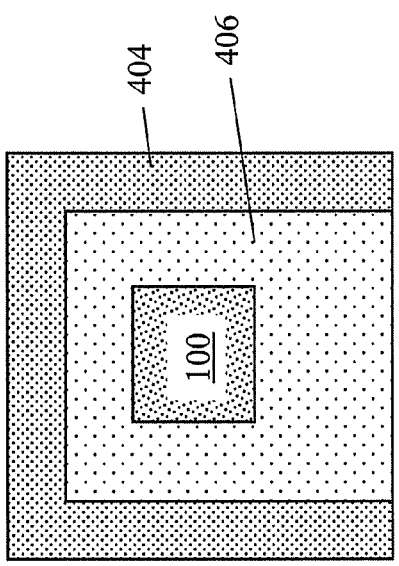
Figure 10E:
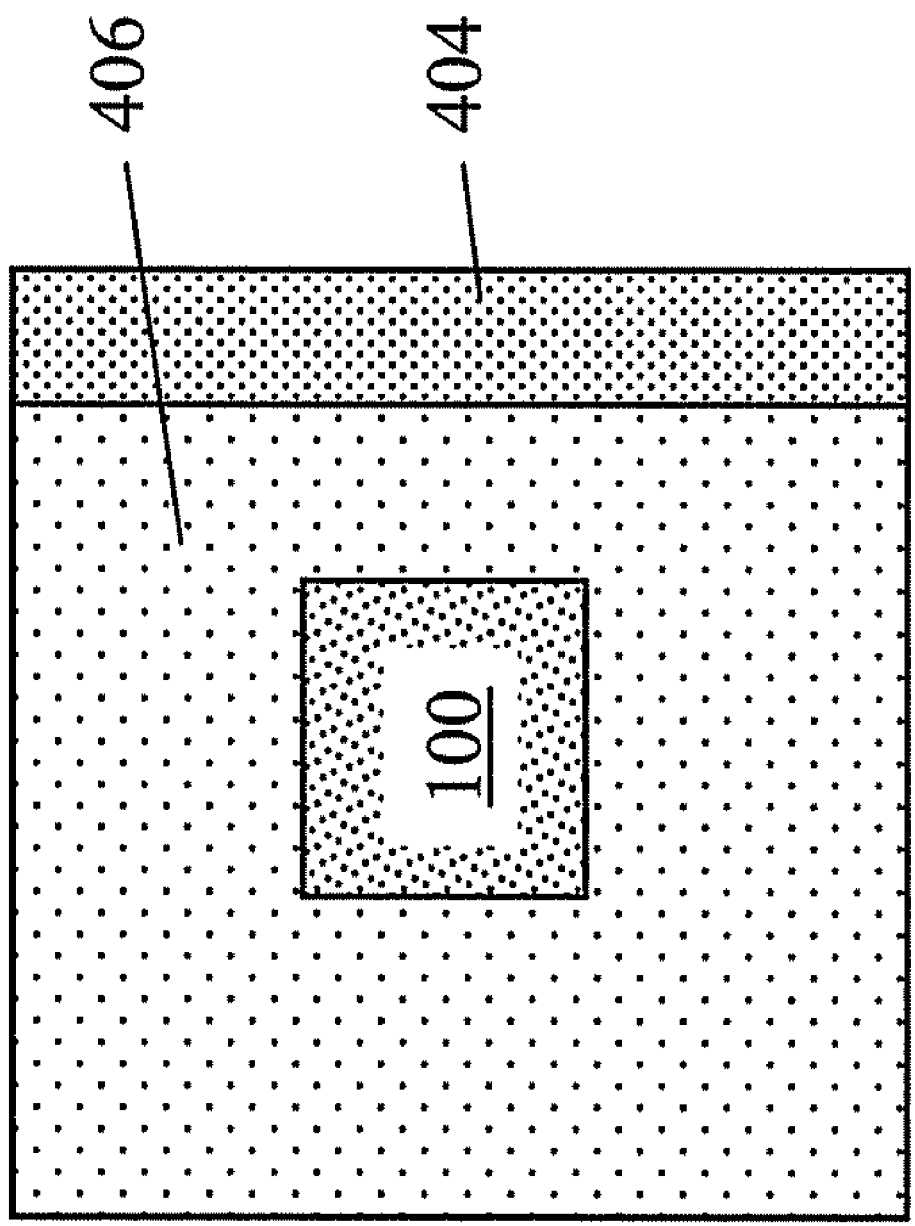

Although the stiffener structure may, in an exemplary embodiment, have sidewalls that completely surround the PET device, other alternatives are also contemplated. For example, FIG. 10(a) is a top down, cross sectional view that illustrates sidewalls of the stiffener structure 404 completely surrounding the PET device 100 and soft buffer structure 406. In contrast, FIG. 10(b) illustrates an alternate sidewall arrangement, in which the PET device 100 and soft buffer structure 406 are partially surrounded by sidewalls of the stiffener structure 406 on three sides thereof. In another embodiment, FIGS. 10(c) and 10(d) depict the PET device 100 and soft buffer structure 406 partially surrounded by sidewalls of the stiffener structure 406 on two sides thereof. In still a further contemplated embodiment, FIG. 10(e) depicts the PET device 100 and soft buffer structure 406 partially surrounded by sidewalls of the stiffener structure 406 on one side thereof. It should further be noted that although the embodiment of FIG. 10(a) illustrates the sidewalls of the stiffener structure 404 in a generally square configuration, other sidewall shapes are also contemplated including, for example, rectangular, circular, oval, etc.

Figure 11A:
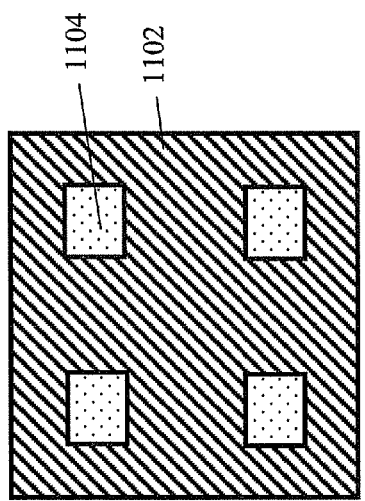
FIGS. 11(a) through 11(f) illustrate top capping layers above the sidewall arrangements of the stiffener structure in FIGS. 10(a) through 10(e).
Figure 11B:
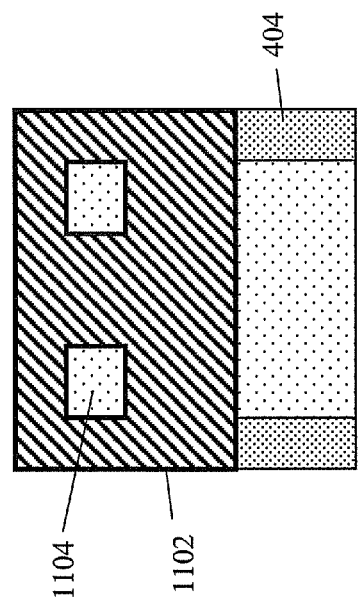
Figure 11C:
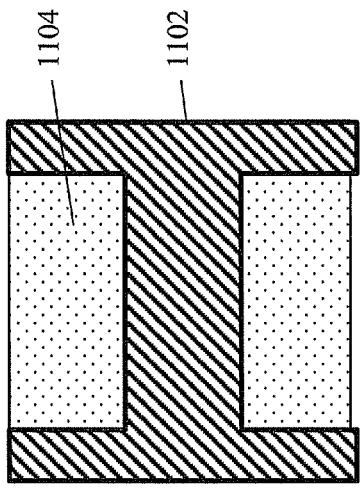
Figure 11D:
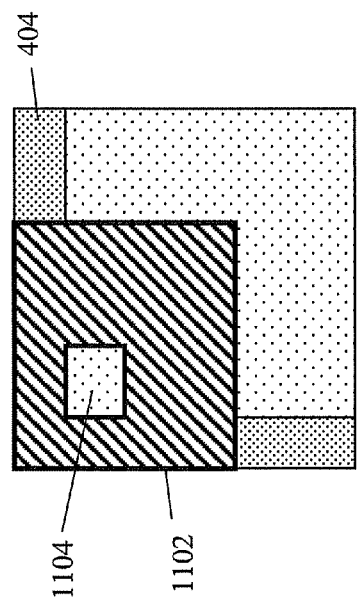
Figure 11E:
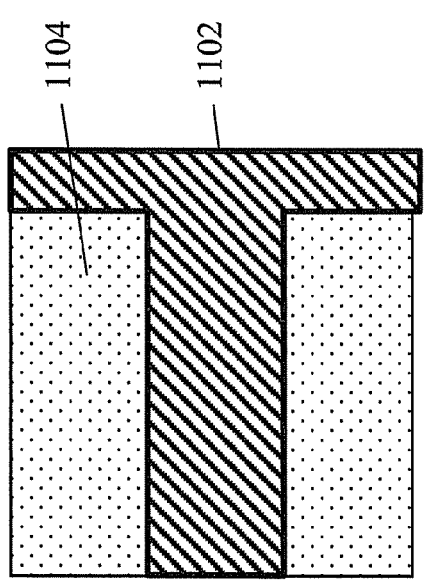
Figure 11F:
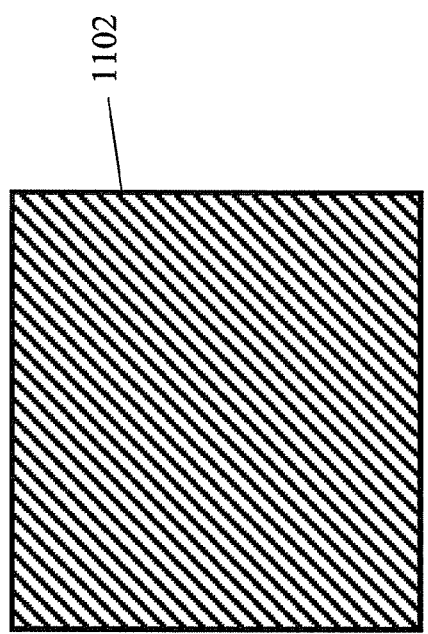

In the event it is desired to use air for the buffer structure 106 instead of SiCOH, for example, FIGS. 11(a) through 11(e) illustrate various capping layer/opening options with respect to the sidewall arrangements of FIG. 10(a) through 10(e), respectively. A top capping layer 1102 of a relatively high modulus material (e.g., SiN or other suitable dielectric) is disposed over the sidewalls of the stiffener structure 404. In addition, one or more openings 1104 are formed within the top capping so as to allow for etching and removal of a sacrificial material. It will be noted that the openings are not formed directly over the (center) portion of the structure, corresponding to the location of the PET device. In FIG. 11(f), the capping layer 1102 remains intact in an embodiment, for example, where a material such as SiCOH will remain as the buffer structure material.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of forming a coupling structure for coupling piezoelectric material generated stresses to an actuated device of an integrated circuit, the method comprising:
   forming a rigid stiffener structure around a piezoelectric (PE) material and the actuated device, the actuated device comprising a piezoresistive (PR) material that has an electrical resistance dependent upon an applied pressure thereto; and
   forming a soft buffer structure around the PE material and PR material, the buffer structure disposed between the PE and PR materials and the stiffener structure, wherein the stiffener structure clamps both the PE and PR materials to a substrate over which the PE and PR materials are formed, and wherein the soft buffer structure permits the PE material freedom to move relative to the PR material, thereby coupling stress generated by an applied voltage to the PE material to the PR material so as change the electrical resistance of the PR material.

2. The method of claim 1, wherein the stiffener structure comprises a material having a Young's modulus on the order of about 60 gigapascals or greater.

3. The method of claim 1, wherein the stiffener structure comprises a material having a Young's modulus on the order of about 100 gigapascals or greater.

4. The method of claim 3, wherein the stiffener structure material is selected from the group of silicon nitride and tungsten.

5. The method of claim 1, wherein the buffer structure comprises a material having a Young's modulus on the order of about 20 gigapascals or less.

6. The method of claim 1, wherein the buffer structure comprises a material having a Young's modulus on the order of about 10 gigapascals or less.

7. The method of claim 6, wherein the buffer structure material is selected from the group of SiCOH and an air gap.

8. The method of claim 1, wherein vertical sidewalls of the stiffener structure completely surround the buffer structure, the PE material, and the PR material.

9. The method of claim 1, wherein vertical sidewalls of the stiffener structure surround the buffer structure, the PE material, and the PR material on three sides thereof.

10. The method of claim 1, wherein vertical sidewalls of the stiffener structure surround the buffer structure, the PE material, and the PR material on two sides thereof.

11. The method of claim 1, wherein vertical sidewalls of the stiffener structure surround the buffer structure, the PE material, and the PR material on one side thereof.

12. A method of forming a coupling structure for coupling piezoelectric material generated stresses within a piezo-effect transistor (PET) device formed in an integrated circuit, the method comprising:

forming a rigid stiffener structure around the PET device, the PET device further comprising a piezoelectric (PE) material disposed between first and second electrodes, and a piezoresistive (PR) material disposed between the second electrode and a third electrode, wherein the first electrode comprises a gate terminal, the second electrode comprises a common terminal, and the third electrode comprises an output terminal such that an electrical resistance of the PR material is dependent upon an applied voltage across the PE material by way of an applied pressure to the PR material by the PE material; and forming a soft buffer structure around the PET device, the buffer structure disposed between the PE and PR materials and the stiffener structure, wherein the stiffener structure clamps both the PE and PR materials to a substrate over which the PE and PR materials are formed, and wherein the soft buffer structure permits the PE material freedom to move relative to the PR material, thereby coupling stress generated by the applied voltage to the PE material to the PR material so as change the electrical resistance of the PR material.

13. The method of claim 12, wherein the stiffener structure comprises a material having a Young's modulus on the order of about 60 gigapascals or greater.

14. The method of claim 12, wherein the stiffener structure comprises a material having a Young's modulus on the order of about 100 gigapascals or greater.

15. The method of claim 14, wherein the stiffener structure material is selected from the group of silicon nitride and tungsten.

16. The method of claim 12, wherein the buffer structure comprises a material having a Young's modulus on the order of about 20 gigapascals or less.

17. The method of claim 12, wherein the buffer structure comprises a material having a Young's modulus on the order of about 10 gigapascals or less.

18. The method of claim 17, wherein the buffer structure material is selected from the group of SiCOH and an airgap.

19. The method of claim 12, wherein vertical sidewalls of the stiffener structure completely surround the buffer structure, the PE material, and the PR material.

20. The method of claim 12, wherein vertical sidewalls of the stiffener structure surround the buffer structure, the PE material, and the PR material on three sides thereof.

21. The method of claim 12, wherein vertical sidewalls of the stiffener structure surround the buffer structure, the PE material, and the PR material on two sides thereof.

22. The method of claim 12, wherein vertical sidewalls of the stiffener structure surround the buffer structure, the PE material, and the PR material on one side thereof.

23. A method of forming a coupling structure for coupling piezoelectric material generated stresses within a piezo-effect transistor (PET) device of an integrated circuit, the method comprising:

performing a first deposition of a rigid stiffener structure material over a substrate;

forming a lower electrode of the PET device;

performing a second deposition of the rigid stiffener structure material over the lower electrode and the first deposition of the rigid stiffener structure material;

performing a first deposition of a soft buffer structure material within the second deposition of the rigid stiffener structure material, and atop the lower electrode;

forming a piezoelectric (PE) material of the PET device within the first deposition of a soft buffer structure material, and atop the lower electrode;

performing a third deposition of the rigid stiffener structure material over the second deposition of the rigid stiffener structure material, and performing a second deposition of the soft buffer structure material over the first deposition of the soft buffer structure material;

forming a common electrode of the PET device over the PE material;

performing a fourth deposition of the rigid stiffener structure material over the third deposition of the rigid stiffener structure material, and performing a third deposition of the soft buffer structure material over the second deposition of the soft buffer structure material and the common electrode;

forming a piezoresistive (PR) material of the PET device within the third deposition of the soft buffer structure material, and atop the common electrode;

performing a fifth deposition of the rigid stiffener structure material over the fourth deposition of the rigid stiffener structure material, the third deposition of the soft buffer structure material, and the PR material; and forming a top electrode over the PR material.

24. The method of claim 23, wherein the rigid stiffener structure material comprises a material having a Young's modulus on the order of about 100 gigapascals or greater.

25. The method of claim 24, wherein the rigid stiffener structure material comprises silicon nitride.

26. The method of claim 25, wherein the soft buffer structure material comprises a material having a Young's modulus on the order of about 10 gigapascals or less.

27. The method of claim 26, wherein the soft buffer structure material comprises SiCOH.

* * * * *